United States Patent
Kim et al.

(10) Patent No.: US 9,285,420 B2
(45) Date of Patent: Mar. 15, 2016

(54) APPARATUS FOR SPINNING TEST TRAY OF IN-LINE TEST HANDLER AND IN-LINE TEST HANDLER

(71) Applicant: MIRAE CORPORATION, Cheonan-si, Chungcheongnam-do (KR)

(72) Inventors: Kyung Tae Kim, Suwon-si (KR); Chan Ho Park, Cheonan-si (KR); Jae Gue Lee, Seoul (KR); Ung Hyun Yoo, Suwon-si (KR); Hae Jun Park, Cheonan-si (KR); Kook Hyung Lee, Suwon-si (KR); Hyun Chae Chung, Suwon-si (KR); Jang Yong Park, Suwon-si (KR)

(73) Assignee: MIRAE CORPORATION, Cheonan-Si (KR)

( * ) Notice: Subject to any disclaimer, the term of this patent is extended or adjusted under 35 U.S.C. 154(b) by 130 days.

(21) Appl. No.: 14/161,494

(22) Filed: Jan. 22, 2014

(65) Prior Publication Data

US 2014/0203832 A1    Jul. 24, 2014

(30) Foreign Application Priority Data

Jan. 22, 2013 (KR) .................. 10-2013-0007050

(51) Int. Cl.
*G01R 31/20* (2006.01)
*G01R 31/28* (2006.01)

(52) U.S. Cl.
CPC .................. *G01R 31/2893* (2013.01)

(58) Field of Classification Search
None
See application file for complete search history.

(56) References Cited

U.S. PATENT DOCUMENTS 7,876,089 B2 * 1/2011 Beom ............... G01R 31/2893
324/750.3
2008/0284412 A1 * 11/2008 Kim ................. G01R 31/2893
324/757.01

* cited by examiner

*Primary Examiner* — Paresh Patel
(74) *Attorney, Agent, or Firm* — Ked & Associates, LLP

(57) ABSTRACT

Disclosed is an apparatus for spinning a test tray and an in-line test handler including the above apparatus, wherein the apparatus may include a supporting unit for supporting a test tray transported between first and second chamber units facing in the different directions, wherein the first chamber unit is provided at a predetermined interval from the second chamber unit; a base unit to which the supporting unit is spinnably connected; and a spinning unit which spins the test tray so that semiconductor devices received in the test tray are tested at the same arrangement in each of the first chamber unit and the second chamber unit.

16 Claims, 25 Drawing Sheets

APPARATUS FOR SPINNING TEST TRAY OF IN-LINE TEST HANDLER AND IN-LINE TEST HANDLER

CROSS REFERENCE TO RELATED APPLICATIONS

This application claims the benefit of the Korean Patent Application No. 10-2013-0007050 filed on Jan. 22, 2013 which is hereby incorporated by reference as if fully set forth herein.

BACKGROUND OF THE INVENTION

1. Field of the Invention

Embodiments of the present invention relate to an apparatus for spinning a test tray and an In-line test handler.

2. Discussion of the Related Art

Memory or non-memory semiconductor device and module IC (hereinafter, referred to as 'semiconductor device') are manufactured through apparatuses for performing various processes. A test handler, one of the apparatuses, is an apparatus enabling to bring the semiconductor device to be tested into contact with a testing device, and to classify the tested semiconductor devices in accordance with a test result. When the semiconductor device is classified as a good quality on basis of the test result, a process for manufacturing the semiconductor device is completed.

FIG. 1 is a plane view schematically illustrating a related art test handler.

Referring to FIG. 1, a related art test handler 1000 may include a loading unit 1100, a testing unit 1200, and an unloading unit 1300.

The loading unit 1100 carries out a loading process for loading the semiconductor device to be tested into a test tray 200. The testing unit 1200 carries out a testing process for bring the semiconductor device received in test tray 200 into contact with a testing device. The unloading unit 1300 carries out an unloading process for detaching the tested semiconductor device from the test tray 200.

The related art test handler 1000 cyclically transfers the test tray 200 inside one apparatus so that the above loading process, testing process and unloading process are sequentially performed to the test tray 200. The related art test handler 1000 may have the following problems.

First, in case of the related art test handler 1000, it is difficult to immediately transfer the test tray 200 which completes the loading process to the testing unit 1200. Until the testing process is completed in the testing unit 1200, the test tray 200 has to be waited in the loading unit 1100, which causes a delay of working time. According as there is a waiting time of the test tray 200 in the loading unit 1100, a time period for the loading process of the next test tray 200 in the loading unit 1100 is also delayed.

Second, the test tray 200 has to be waited in the loading unit 1100 until the testing process is completed, as mentioned above. Thus, in case of the related art test handler 1000, the test tray 200 which completes the unloading process is not immediately transferred to the loading unit 1100, but is waited in the unloading unit 1300. Accordingly, a time period for the unloading process of the next test tray 200 in the unloading unit 1300 is delayed.

Third, in case of the related art test handler 1000, even if there are some problems in any part of the loading unit 1100, the testing unit 1200 and the unloading unit 1300, all structures or works including normal structures or works have to be stopped.

SUMMARY OF THE INVENTION

Accordingly, embodiments of the present invention are directed to an apparatus for spinning a test tray and an in-line test handler that substantially obviates one or more problems due to limitations and disadvantages of the related art.

An aspect of embodiments of the present invention is to provide an apparatus for spinning a test tray and an in-line test handler including the apparatus, which prevents a delay of working time even though there is a difference in time period for each of loading process, unloading process and testing process.

Another aspect of embodiments of the present invention is to provide an apparatus for spinning a test tray and an in-line test handler including the apparatus, which prevents a working time from being influenced by some problems which might occur in apparatuses for carrying out loading process, testing process and unloading process.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an in-line test handler that may include a first chamber unit for carrying out a testing process of a semiconductor device; a second chamber unit for carrying out a testing process of a semiconductor device, wherein the first and second chamber unit facing in the different directions are provided at a predetermined interval from each other; a sorting unit for carrying out a loading process for receiving the semiconductor device to be tested in the test tray, and an unloading process for detaching the tested semiconductor device from the test tray, wherein the sorting unit is provided at a predetermined interval from the first chamber unit and the second chamber unit; a conveyor unit for transporting the test tray so as to make the sorting unit, the first chamber unit and the second chamber connected in-line; and a spinning apparatus for spinning the test tray, which spins the test tray so as to carry out the testing process under the circumstances that the semiconductor devices received in the test tray are arranged at the same position in each of the first chamber unit and the second chamber unit.

In another aspect of embodiments of the present invention, there is provided an apparatus for spinning a test tray that may include a supporting unit for supporting a test tray transported between first and second chamber units facing in the different directions, wherein the first chamber unit is provided at a predetermined interval from the second chamber unit; a base unit to which the supporting unit is spinnably connected; and a spinning unit, provided in the base unit, for spinning the supporting unit so as to spin the test tray being supported by the supporting unit, wherein the spinning unit spins the test tray so that semiconductor devices received in the test tray are tested at the same arrangement in each of the first chamber unit and the second chamber unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, an apparatus for spinning a test tray according to embodiments of the present invention will be described with reference to the accompanying drawings.

Figure 1:
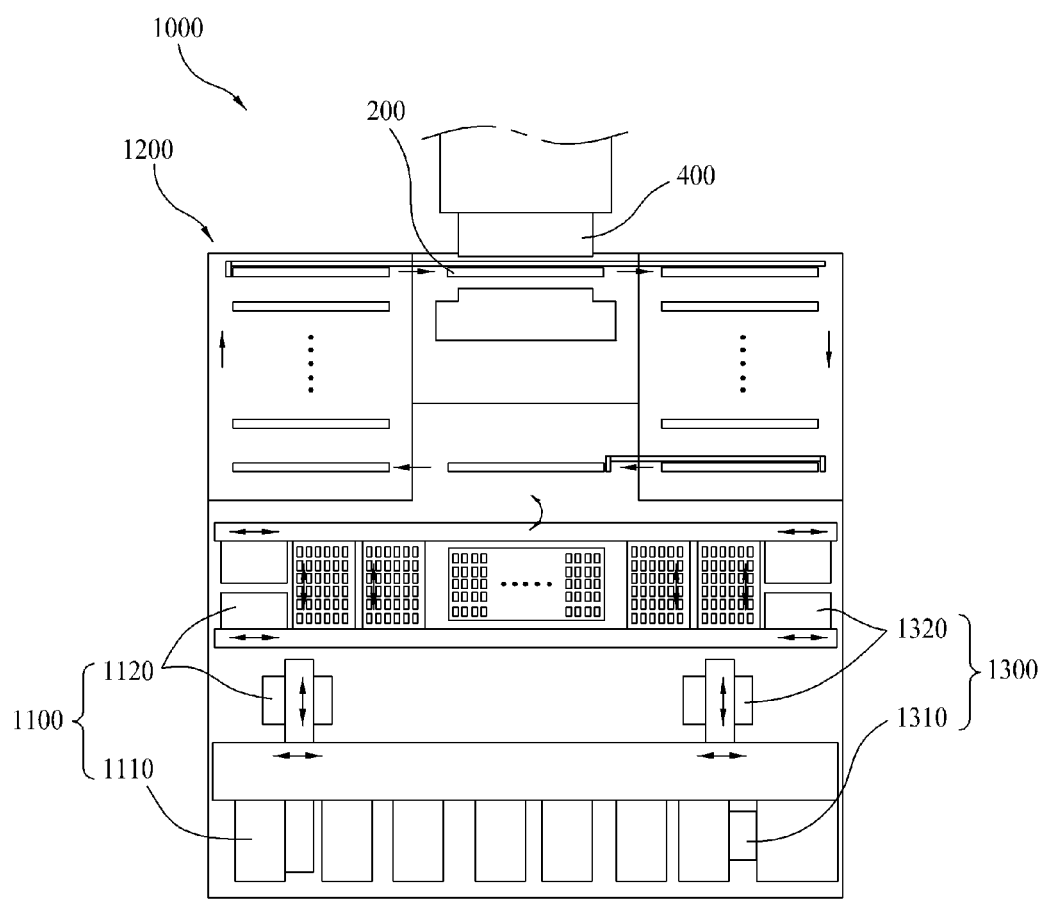
FIG. 1 is a plane view for schematically illustrating a related art test handler.
Figure 2:
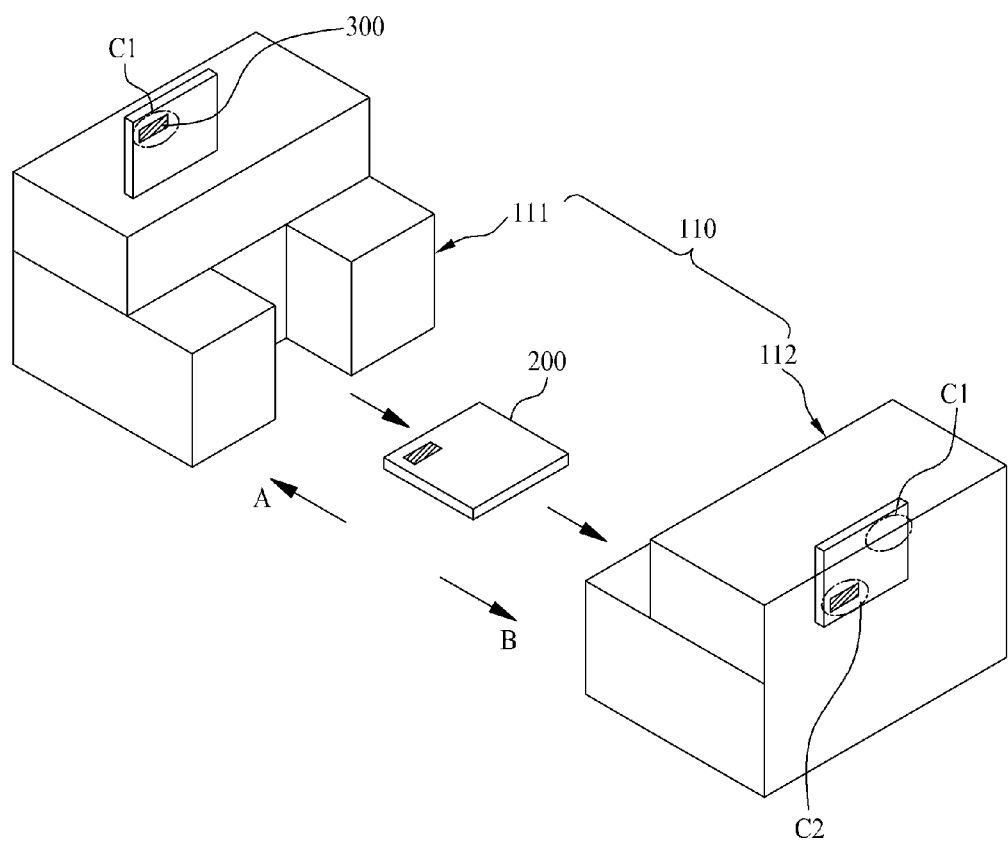
FIGS. 2 and 3 are concept views for illustrating effects in an apparatus for spinning a test tray according to the present invention.
Figure 3:
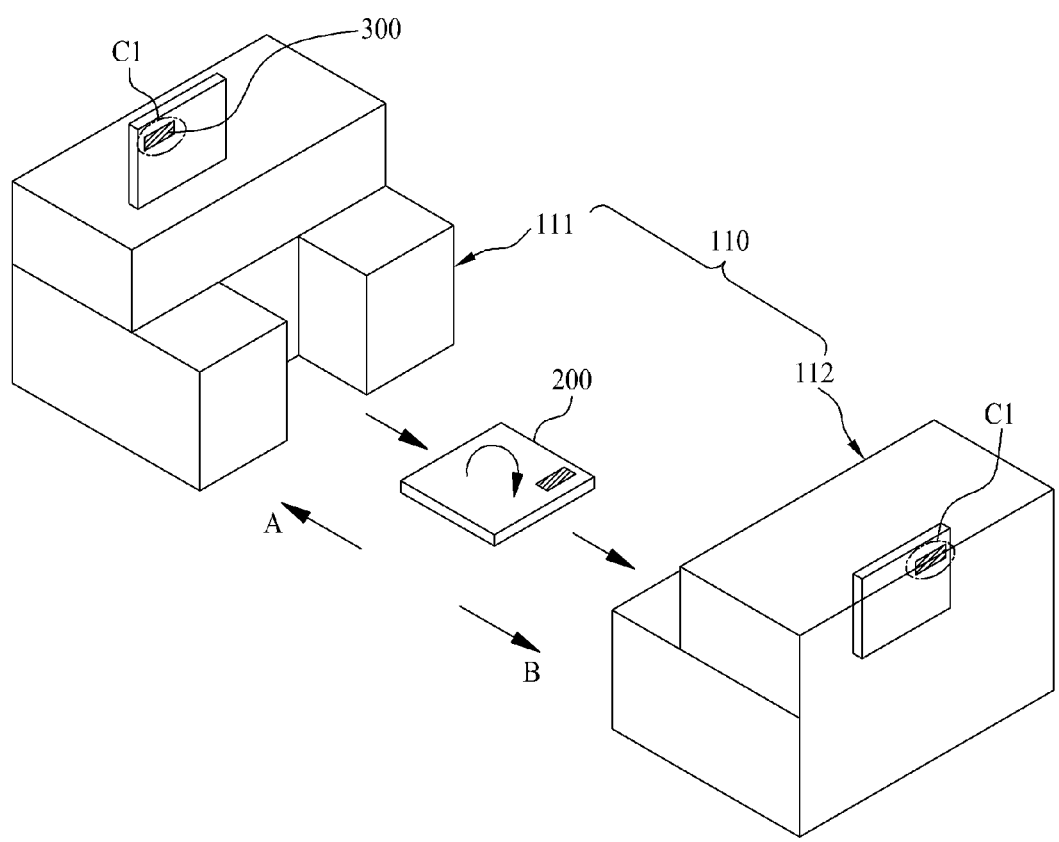
Figure 4:
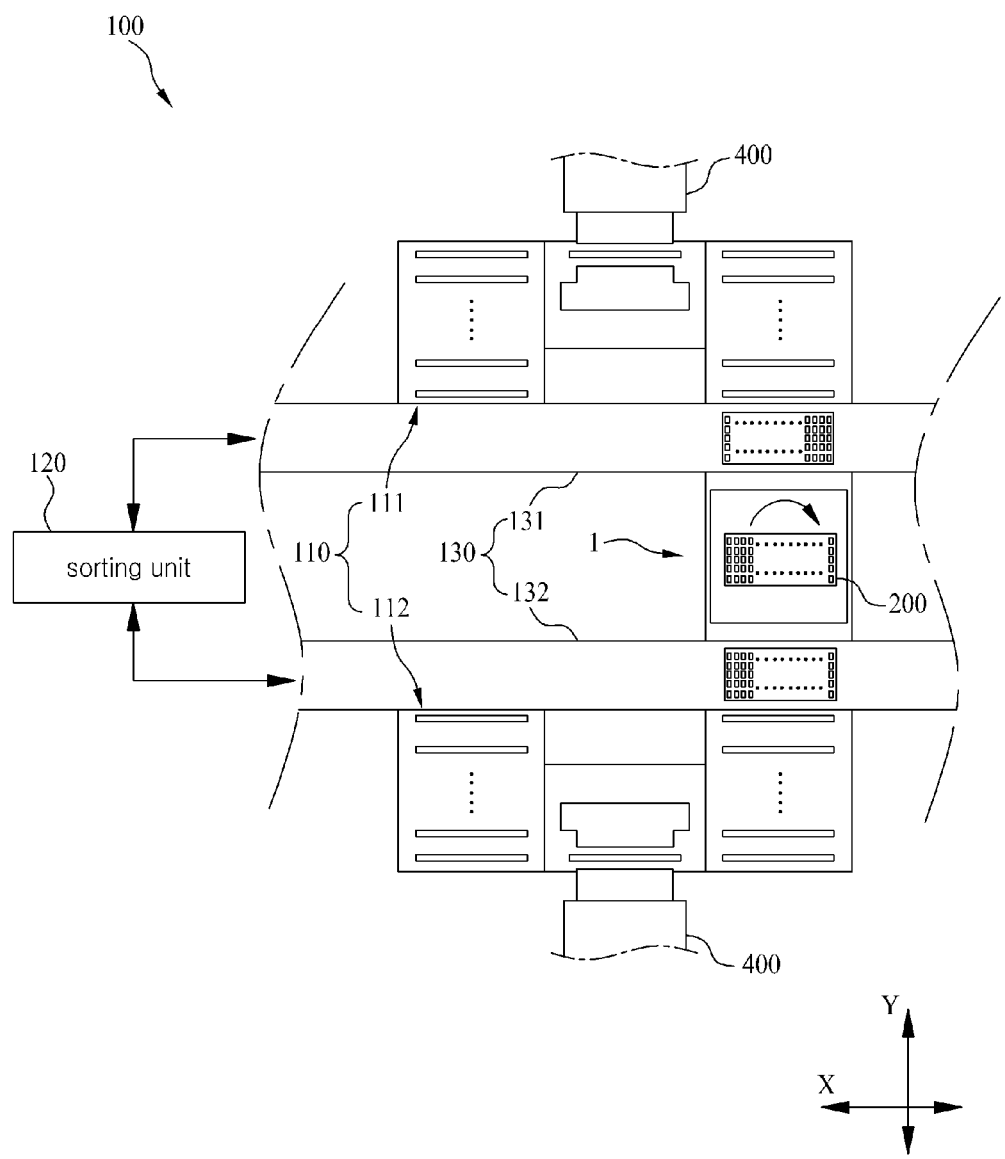
FIG. 4 is a plane view for schematically illustrating an in-line test handler including an apparatus for spinning a test tray according to the present invention.

Referring to FIGS. 2 to 4, the apparatus 1 for spinning a test tray according to the present invention is provided to spin a test tray 200 in an in-line test handler 100. The in-line test handler 100 may include a plurality of chamber units 110, a sorting unit 120, and a conveyor unit 130. In this case, a testing process for a semiconductor device received in the test tray 200 is carried out in each chamber unit 110. The sorting unit 120 carries out loading and unloading processes for the semiconductor device. The sorting unit 120 is provided at a predetermined interval from each chamber unit 110. The conveyor unit 130 transports the test tray 200. The conveyor unit 130 transports the test tray 200 so that the testing process for the test tray 200 which completes the loading process by the sorting unit 120 is carried out through at least one among the plurality of chamber units 110. Also, the conveyor unit 130 transports the test tray 200 so that the unloading process for the test tray 200 which completes the testing process via at least one of the chamber units 110 is carried out by the sorting unit 120. That is, the chamber units 110 and the sorting unit 120 are connected in-line by the conveyor unit 130.

In this case, the in-line test handler 100 may include a first chamber unit 111 and a second chamber unit 112 facing in different directions, wherein the first and second chamber units 111 and 112 are provided at a predetermined interval from each other. The apparatus 1 for spinning a test tray according to the present invention spins the test tray 200 transported between the first chamber unit 111 and the second chamber unit 112. Thus, the apparatus 1 for spinning a test tray according to the present invention may be provided in such a manner that an arrangement for testing the semiconductor devices received in the test tray 200 is identical in the first chamber unit 111 and the second chamber unit 112. This will be described in detail as follows.

First, as shown in FIGS. 2 and 3, the first chamber unit 111 and the second chamber unit 112 facing in opposite directions are provided at a predetermined interval from each other. In this case, unless the test tray 200 unloaded from the first chamber unit 111 and supplied to the second chamber unit 112 spins, an arrangement for testing the semiconductor devices received in the test tray 200 may be differently provided in the first chamber unit 111 and the second chamber unit 112. In order to show more precisely, as shown in FIGS. 2 and 3, any one semiconductor device 300 among the semiconductor devices received in the test tray 200 is indicated as a shaded rectangle section.

As shown in FIG. 2, with respect to a direction facing the front of first chamber unit 111 (A arrow direction), the testing process is carried out under the condition that the semiconductor device 300 is positioned at the upper left side of the test tray 200 in the first chamber unit 111. However, unless the test tray 200 unloaded from the first chamber unit 111 spins, the testing process is carried out under the condition that the corresponding semiconductor device 300 is positioned at the lower right side of the test tray 200 in the second chamber unit 112 with respect to a direction facing the front of second chamber unit 112 (B arrow direction). When testing the semiconductor devices received in the test tray 200, the arrangement for testing the semiconductor device in the first chamber unit 111 is different from the arrangement for testing the semiconductor device in the second chamber unit 112.

Accordingly, when carrying out the unloading process, the sorting unit 120 (See FIG. 4) may have difficulties in classifying the corresponding semiconductor device 300 by classes. As the testing process is carried out in the chamber unit 110, the class is given with respect to a position of the semiconductor device. This is because the semiconductor device 300 is tested at a first position (C1) in the first chamber unit 111, and is tested at a second position (C2) in the second chamber unit 112, wherein the first position (C1) is different from the second position (C2). Thus, the class for the semiconductor device positioned at the first position (C1) of the first chamber unit 111 and the second chamber unit 112 may be given to the different semiconductor devices, whereby it is difficult for the sorting unit 120 (See FIG. 4) to precisely carry out the unloading process.

In order to overcome this problem, the apparatus 1 for spinning a test tray according to the present invention spins the test tray 200 so that the arrangement for testing the semiconductor devices received in the test tray 200 is identically provided in the first chamber unit 111 and the second chamber unit 112.

Accordingly, as shown in FIG. 3, with respect to the direction facing the front of the first chamber unit 111 (A arrow direction), the testing process is carried out under the condition that the semiconductor device 300 is positioned at the upper left side of the test tray 200 in the first chamber unit 111. Also, with respect to the direction facing the front of the second chamber unit 112 (B arrow direction), the testing process is carried out under the condition that the corresponding semiconductor device 300 is positioned at the upper left side of the test tray 200 in the second chamber unit 111. That is, the testing process is carried out under the condition that the semiconductor device 300 is identically positioned at the first position (C1) in each of the first chamber unit 111 and the second chamber unit 112. The semiconductor devices received in the test tray 200 are tested under the condition they are arranged at the same position in each of the first chamber unit 111 and the second chamber unit 112.

Accordingly, the apparatus 1 for spinning a test tray according to the present invention enables to carry out the testing process under the condition that the semiconductor devices received in the test tray 20 are arranged at the same position in each of the first chamber unit 111 and the second chamber unit 112, to thereby improve preciseness and easiness for the unloading process by the sorting unit 120 (See FIG. 4). Also, the apparatus 1 for spinning a test tray according to the present invention may promote the following efficiency.

First, the apparatus 1 for spinning a test tray according to the present invention enables to carry out the testing process under the condition that the semiconductor devices received in the test tray 200 are arranged at the same position in the respective chamber unit 110, so that it is possible to remove restrictions on providing the chamber units 110 in the same direction. Thus, the apparatus 1 for spinning a test tray according to the present invention enables to improve easiness of working and degree of freedom on the process for arranging the chamber units 110 in the in-line test handler 100. Also, the apparatus 1 for spinning a test tray according to the present invention is embodied to realize a minimum movement of the test tray 200 among the sorting unit 120 and the chamber units 110 in the in-line test handler 100.

Second, the apparatus 1 for spinning a test tray according to the present invention enables to re-arrange the chamber unit 110 regardless of direction when a processing line is expanded or reduced by adding or removing the chamber unit 110 in the in-line test handler 100, to thereby improve easiness in working for expanding or reducing the processing line.

Third, in case of the apparatus 1 for spinning a test tray according to the present invention, the testing process is carried out under the circumstances that the semiconductor devices received in the test tray 200 are arranged at the same position in the respective chamber units 110, whereby the conveyor unit 130 enables to efficiently distribute the test tray 200 to the chamber units 110 regardless of the direction of the chamber units 110 in consideration of time consumed for carrying out each of the loading process, the unloading process and the testing process. Thus, the apparatus 1 for spinning a test tray according to the present invention improves an operational ratio of apparatuses in the in-line test handler 100, and reduces a time period consumed until the loading process, the testing process and the sorting process for the semiconductor device are completed.

To this end, the apparatus 1 for spinning a test tray according to the present invention may include the following structures.

Figure 5:
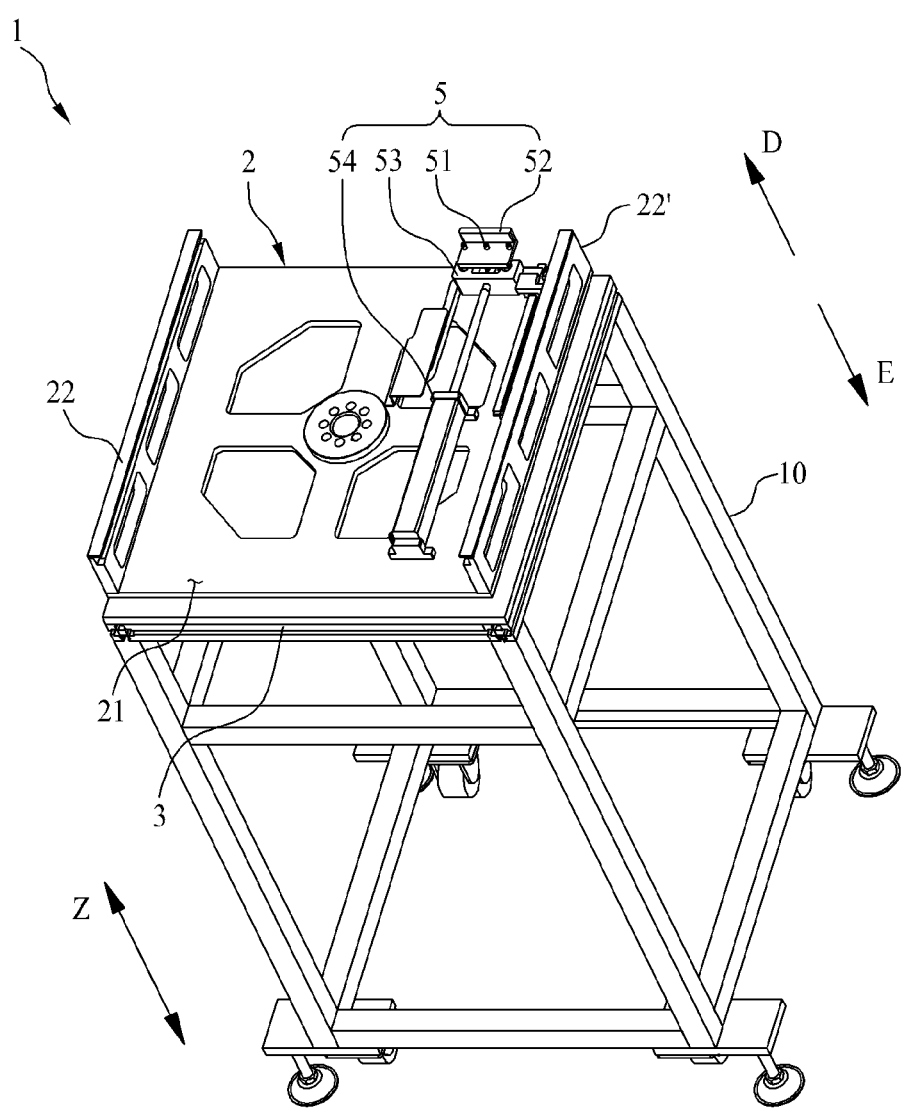
FIG. 5 is a perspective view for illustrating an apparatus for spinning a test tray according to the present invention.
Figure 6:
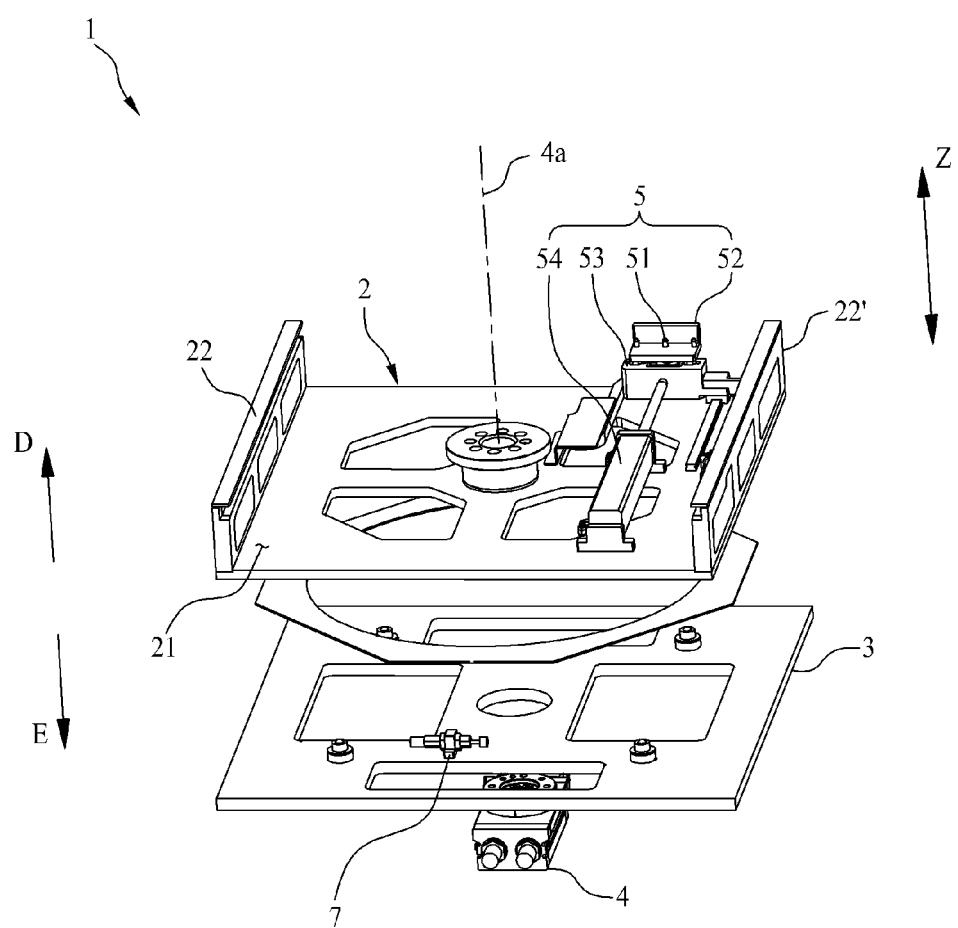
FIG. 6 is an exploded perspective view for illustrating an apparatus for spinning a test tray according to the present invention.

Referring to FIGS. 4 to 6, the apparatus 1 for spinning a test tray according to the present invention may include a supporting unit 2 for supporting the test tray 200, a base unit 3 to which the supporting unit 2 is spinnably connected, and a spinning unit 4 (See FIG. 6) for spinning the supporting unit 2 so as to spin the test tray 200 being supported by the supporting unit 2.

The supporting unit 2 supports the test tray 200 (See FIG. 4) unloaded from the chamber units 110 (See FIG. 4). The supporting unit 2 may support the test tray 200 unloaded from the first chamber unit 111 (See FIG. 4). In this case, after the test tray 200 is unloaded from the first chamber unit 111, the unloaded test tray 200 may spin while being supported by the supporting unit 2, and then may be supplied to the second chamber unit 112 (See FIG. 4). The supporting unit 2 may support the test tray 200 unloaded from the second chamber unit 112. In this case, after the test tray 200 is unloaded from the second chamber unit 112, the unloaded test tray 200 may spin while being supported by the supporting unit 2, and then may be supplied to the first chamber unit 111.

The supporting unit 2 may be positioned between the first chamber unit 111 and the second chamber unit 112. The supporting unit 2 makes the first chamber unit 111 and the second chamber unit 112 connected in-line by the use of conveyor unit 130 (See FIG. 4). For example, the conveyor unit 130 may include a first conveyor module 131 (See FIG. 4) for making the first chamber unit 111 and the sorting unit 120 connected in-line, and a second conveyor module 132 (See FIG. 4) for making the second chamber unit 112 and the sorting unit 120 connected in-line. In this case, the supporting unit 2 is provided between the first conveyor module 131 and the second conveyor module 132, whereby the first conveyor module 131 and the second conveyor module 132 are connected in-line. Accordingly, the first chamber unit 111 and the second chamber unit 112 are connected in-line by the supporting unit 2.

The supporting unit 2 may include a through hole 21 through which the test tray 200 passes. The supporting unit 2 is formed in a shape whose one side is opened by the through hole 21. The test tray 200 is loaded into the supporting unit 2 via the through hole 21, and the test tray 200 is unloaded from the supporting unit 2 via the through hole 21.

The supporting unit 2 may include guiding members 22 and 22' for guiding the movement of the test tray 200. Both sides of the test tray 200 are inserted into the guiding members 22 and 22', and are moved along the guiding members 22 and 22. Thus, the apparatus 1 for spinning a test tray according to the present invention improve preciseness in the process for loading the test tray 200 into the supporting unit 2 and the process for unloading the test tray 200 from the supporting unit 2. Also, the guiding members 22 and 22' may support the test tray 200, wherein each of the guiding members 22 and 22 may be formed in '⌐' shape.

Referring to FIGS. 4 to 6, the base unit 3 supports the supporting unit 2. The supporting unit 2 is spinnably connected with the base unit 3. The supporting unit 2 may be spinnably connected with the base unit 3 by the use of bearing (not shown). The base unit 3 is connected with a main body 10. The main body 10 may support the base unit 3 so as to make the supporting unit 2 positioned at a height enabling to transfer the test tray 200 (See FIG. 4) between the supporting unit 2 and the conveyor unit 130 (See FIG. 4). The main body 10 may support the base unit 3 so as to make the supporting unit 2 positioned between the first conveyor module 131 (See FIG. 4) and the second conveyor module 132 (See FIG. 4).

Referring to FIGS. 3 to 6, the spinning unit 4 is provided in the base unit 3. The spinning unit 4 may spin the supporting unit 2. Thus, the spinning unit 4 may spin the test tray 200 being supported by the supporting unit 2. Accordingly, the spinning unit 4 spins the test tray 200 so that the semiconductor devices received in the test tray 200 are tested under the circumstance that they are arranged at the same position in each of the first chamber unit 111 and the second chamber unit 112.

The spinning unit 4 may be positioned below the base unit 3. In this case, the base unit 3 may be positioned between the spinning unit 4 and the supporting unit 2. The spinning unit 4 may be connected with the supporting unit 2 through the base unit 3. The spinning unit 4 makes the supporting unit 2 spin with respect to a spinning axis 4a (See FIG. 6) formed in a vertical direction (Z-axis direction) from the base unit 3 toward the supporting unit 2. Accordingly, the test tray 200 being maintained in a horizontal state may spin by the spinning unit 4.

If providing the first chamber unit 111 and the second chamber unit 112 facing in the opposite direction, as shown in FIG. 3, the spinning unit 4 (See FIG. 6) spins the test tray 200 at the angle of 180°. Accordingly, in comparison to the test tray 100 unloaded from the first chamber unit 111, the test tray 100 may spin at the angle of 180°, and may be supplied to the second chamber unit 112. Thus, the semiconductor devices received in the test tray 200 are tested under the circumstance that they are arranged at the same position in each of the first chamber unit 111 and the second chamber unit 112.

If the first chamber unit 111 and the second chamber unit 112 are provided in the different directions by the angle of 90°, although not shown, the spinning unit 4 may spin the test tray 200 at the angle of 90°. That is, the spinning unit 4 may spin the test tray 200 by the predetermined angle corresponding to the angle made by the first chamber unit 111 and the second chamber unit 112 facing in the different directions. The spinning unit 4 may spin the test tray 200 clockwise or counterclockwise with respect to the spinning axis 4a (See FIG. 6).

The spinning unit 4 may include a motor (not shown) for producing a spinning power to spin the supporting unit 2. The motor is directly connected with the supporting unit 2, to thereby spin the supporting unit 2. If the motor is provided at a predetermined interval from the supporting unit 2, the spinning unit 4 may further include a connection means for connecting the motor and the supporting unit 2 with each other. The connection means may be pulley and belt.

Referring to FIGS. 3 and 6 to 12, the apparatus 1 for spinning a test tray according to the present invention may further include a transferring unit 5, provided in the supporting unit 2, for transferring the test tray 200.

The transferring unit 5 transfers the test tray 200, which is unloaded from the first chamber unit 111 (See FIG. 4), to the supporting unit 2. The transferring unit 5 may transfer the test tray 200 unloaded from the first conveyor module 131 (See FIG. 4) to the supporting unit 2. In this case, the test tray 200 unloaded from the first conveyor module 131 corresponds to the test tray 200 unloaded from the first chamber unit 111. If the test tray 200 is supported by the supporting unit 2, the spinning unit 4 spins the supporting unit 2 so as to spin the test tray 200 supported by the supporting unit 2.

The transferring unit 5 unloads the test tray 200 from the supporting unit 2 so as to supply the test tray 200 which spins by the spinning unit 4 to the second chamber unit 112 (See FIG. 4). The transferring unit 5 may unload the test tray 200 which spins by the spinning unit 4 from the second conveyor module 132 (See FIG. 4). In this case, the test tray 200 unloaded from the second conveyor module 132 may be supplied to the second chamber unit 112.

As mentioned above, the apparatus 1 for spinning a test tray according to the present invention spins the test tray 200 so as to carry out the testing process under the circumstance that the semiconductor devices received in the test tray 200 are arranged at the same position in each of the first chamber unit 111 and the second chamber unit 112, and transfers the test tray 200 between the first chamber unit 111 and the second chamber unit 112. In the above description, the test tray 200 is unloaded from the first chamber unit 111, and is then supplied to the second chamber unit 112. The transferring unit 5 may carry out the spinning and transferring functions for the test tray 200 unloaded from the second chamber unit 112 and supplied to the first chamber unit 111.

Referring to FIGS. 3 and 6 to 12, the transferring unit 5 may include an inserting member 51 (See FIG. 6) to be inserted into the test tray 200, an elevating member 52 (See FIG. 6) to which the inserting member 51 is connected, an elevating module 53 (See FIG. 6) for elevating the elevating member 52, and a driving unit 54 (See FIG. 6) for moving the elevating module 53.

The inserting member 51 protrudes from the elevating member 52 in an upper direction (D arrow direction, See FIG. 7) from the base unit 3 toward the supporting unit 2. When the elevating module 53 raises the elevating member 52, the inserting member 51 is inserted into a transferring groove 210 (See FIG. 7) of the test tray 200. According as the inserting member 51 moves, the test tray 200 may be transferred. If the elevating module 53 lowers the elevating member 52, the inserting member 51 is detached from the transferring groove 210. Accordingly, the test tray 200 may be transferred from the supporting unit 2 to the conveyor unit 130 (See FIG. 3) without causing any hindrance to the inserting member 51. Also, the test tray 200 may be transferred from the conveyor unit 130 to the supporting unit 2 without causing any hindrance to the inserting member 51.

The inserting member 51 may be formed in a cylindrical shape, but not limited to this shape. The inserting member 51 may be formed in any shape capable of being inserted into or detached from the transferring groove 210, for example, rectangular parallelepiped. The transferring unit 5 may include the plurality of inserting members 51. In this case, the inserting members 51 may be provided at fixed intervals. FIG. 6 shows the transferring unit 5 including the three inserting members 51, but not limited to this structure. The transferring unit 5 may include the two inserting members 51, or the four or more inserting members 51. The test tray 200 may include the transferring grooves 210 whose number is roughly identical to the number of the inserting members 51.

The elevating member 52 is connected with the elevating module 53. The inserting member 51 is connected with the elevating member 52. According as the elevating module 53 raises the elevating member 52, the inserting member 51 is also raised. Meanwhile, if the elevating module 53 lowers the elevating member 52, the inserting member 51 is also lowered. The elevating member 52 may include a propping member 521 connected with the inserting member 51, and a supporting member 522 for supporting the test tray 200.

The propping member 521 is connected with the elevating module 53. The inserting member 51 protruding from the propping member 521 in the upper direction (D arrow direction) is formed in the propping member 521. The propping member 521 may be formed in a rectangular plate shape.

The supporting member 522 is connected with the propping member 521. The supporting member 522 protruding from the propping member 521 in the upper direction (D arrow direction) is connected with the propping member 521. When the supporting unit 4 spins the supporting unit 2, the supporting member 522 supports lateral surfaces of the test tray 200 supported by the supporting unit 2, to thereby prevent the test tray 200 from being detached by a centrifugal force. The supporting member 522 supports the test tray 200 so that the test tray 200 transferred to the supporting unit 2 by the conveyor unit 130 is stopped at a carrying-in position. The carrying-in position corresponds to the position at which the transferring groove 210 of the test tray 200 is provided above the inserting member 51. That is, the supporting member 522 may function as a stopper for the test tray 200 so as to precisely stop the test tray 200 at the carrying-in position.

The supporting member 522 and the propping member 521 may be formed as one body. By the supporting member 522 and the propping member 521, the elevating member 52 may be formed in "⌐" shape. The supporting member 522, the propping member 521 and the inserting member 51 may be formed as one body.

The elevating module 53 is connected with the driving unit 54. The elevating module 53 may elevate the elevating member 52. When the test tray 200 is positioned at the carrying-in position, the elevating module 53 raises the elevating member 52, whereby the inserting member 51 is inserted into the transferring groove 210. If the spinning unit 4 spins the test tray 200 supported by the supporting unit 2 by spinning the supporting unit 2, the elevating module 53 lowers the elevating member 52, whereby the inserting member 51 is detached from the transferring groove 210.

The elevating module 53 may elevate the elevating member 52 by a cylinder method using hydraulic cylinder or pneumatic cylinder, a ball screw method using motor and ball screw, a gear method using motor, rack gear and pinion gear, a belt method using motor, pulley and belt, or a linear motor using coil and permanent magnet.

The driving unit 54 moves the elevating module 53. According as the elevating module 53 moves, the elevating member 52 and the inserting member 51 move. The driving unit 54 is connected with the supporting unit 2. The driving unit 54 moves the elevating module 53 so as to transfer the test tray 200 from the carrying-in position to a spinning position. The spinning position corresponds to the position at which the test tray 200 is provided inside the supporting unit 2, that is, the position for preventing the test tray 200 from protruding out of the supporting unit 2. Accordingly, when the spinning unit 4 spins the supporting unit 2, it is possible to prevent the test tray 200 from colliding with another structure. If the spinning unit 4 spins the test tray 200 at the spinning position, the driving unit 54 moves the elevating module 53 so as to transfer the test tray 200 from the spinning position to a carrying-out position. The carrying-out position corresponds to the position at which the test tray 200 is unloaded from the supporting unit 2 by the conveyor unit 130.

The driving unit 54 may move the elevating module 53 by a cylinder method using hydraulic cylinder or pneumatic cylinder, a ball screw method using motor and ball screw, a gear method using motor, rack gear and pinion gear, a belt method using motor, pulley and belt, or a linear motor using coil and permanent magnet. The driving unit 54 may include LM guide rail and LM guide block for guiding a linear movement of the elevating module 53. The LM guide rail may be connected with the supporting unit 2. The LM guide block is linear-movably connected with the LM guide rail. The elevating module 53 may be connected with the LM guide block.

As mentioned above, the spinning unit 4 and the transferring unit 5 including the inserting member 51, elevating member 52, the elevating module 53 and the driving unit 54 may be operated as follows.

Figure 7:
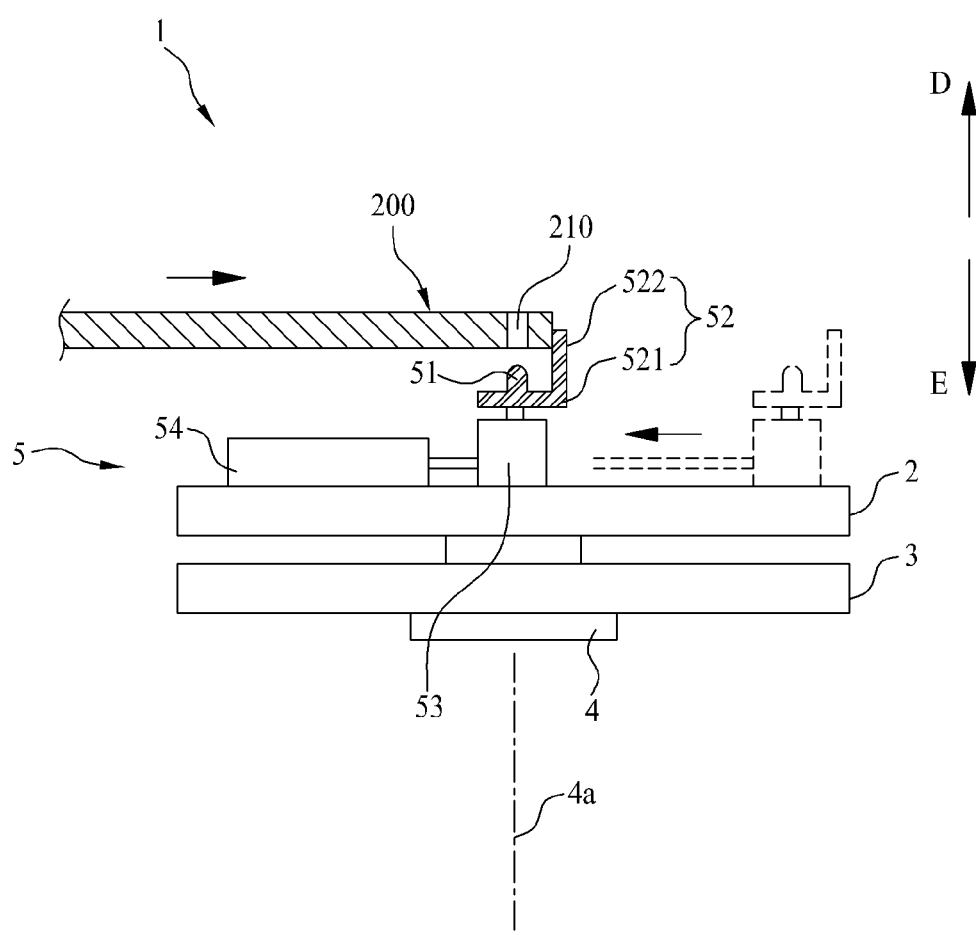
FIGS. 7 to 12 are lateral views for explaining an operation of an apparatus for spinning a test tray according to the present invention.

First, if the first conveyor module 131 (See FIG. 4) transports the test tray 200 to the supporting unit 2, as shown in FIG. 7, the driving unit 54 moves the elevating module 53 to the first conveyor module 131 (See FIG. 4). In this case, the elevating member 52 is lowered by the elevating module 53 so as to prevent the inserting member 51 from colliding with the test tray 200. The elevating module 53 may adjust a height of the elevating member 52 so as to provide the elevating member 52 at the position capable of supporting the lateral surfaces of the test tray 200 without any collision between the inserting member 51 and the test tray 200. Accordingly, the supporting member 522 may support the test tray 200 so as to precisely stop the test tray 200 at the carrying-in position.

Figure 8:
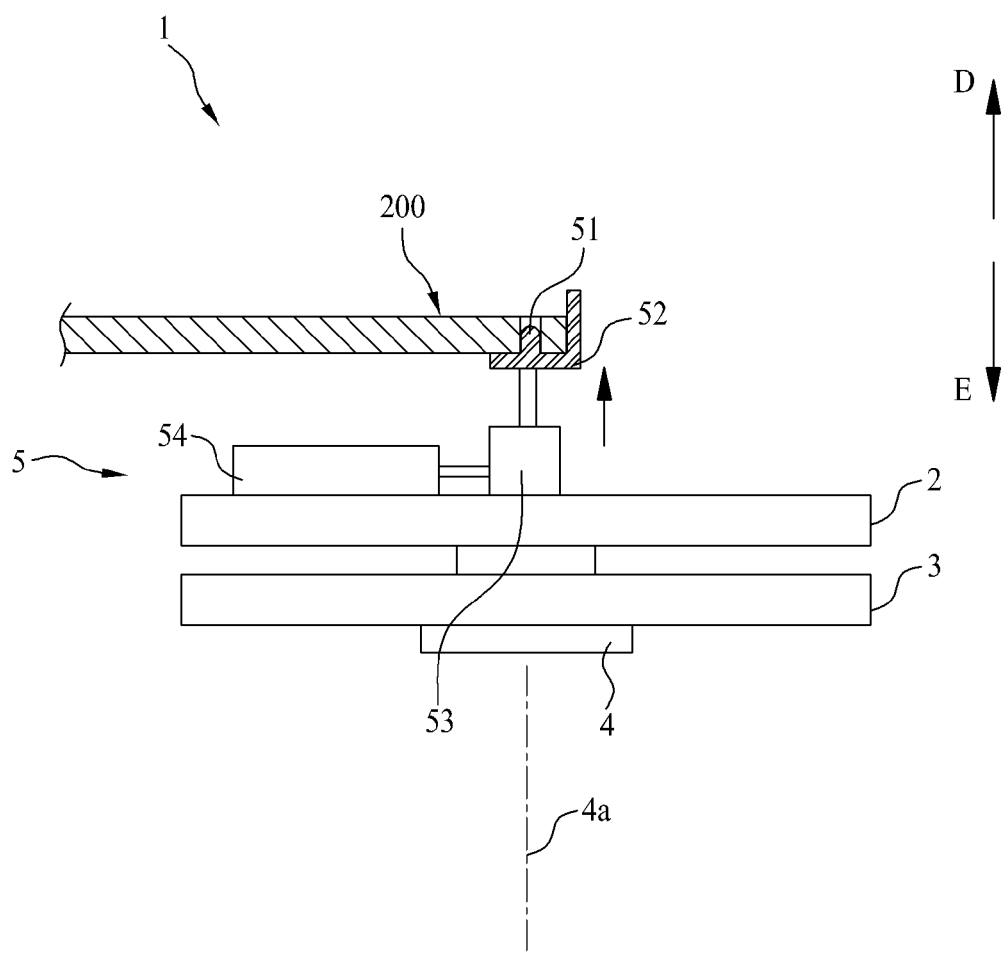

Then, if the test tray 200 is positioned at the carrying-in position, as shown in FIG. 8, the elevating module 53 raises the elevating member 52. Accordingly, the inserting member 51 is inserted into the transferring groove 210.

Figure 9:
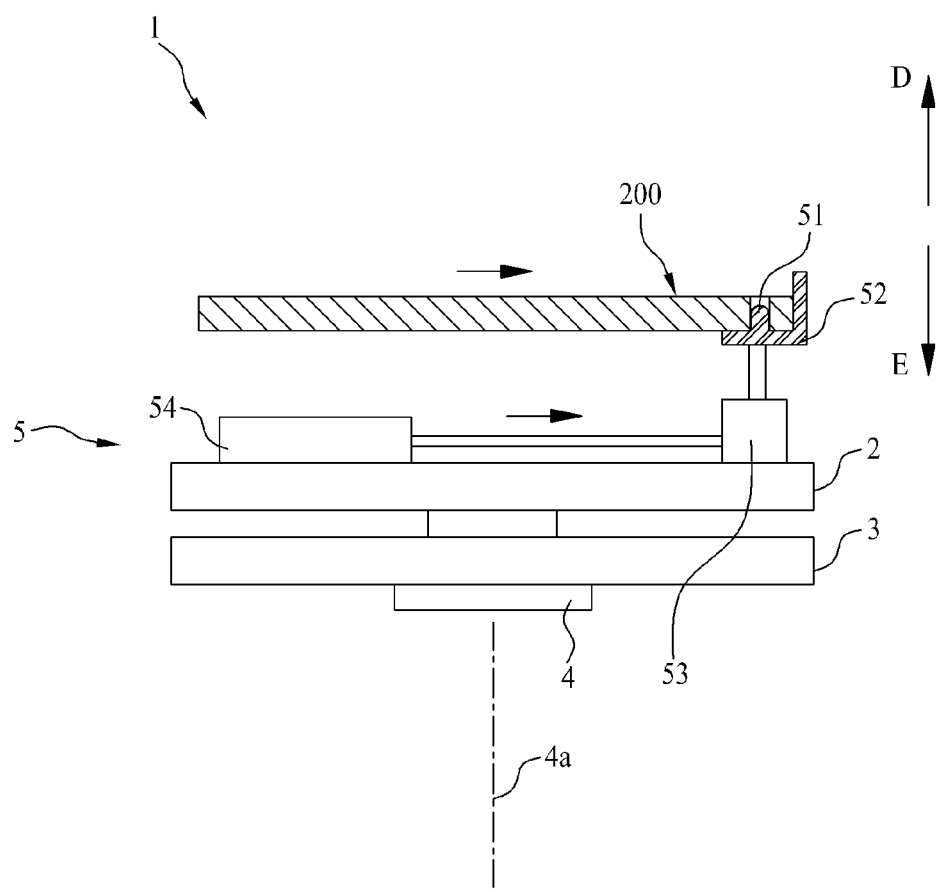

After that, if the inserting member 51 is inserted into the transferring groove 210, as shown in FIG. 9, the driving unit 54 moves the elevating module 53 so as to transfer the test tray 200 from the carrying-in position to the spinning position. Accordingly, the test tray 200 is positioned inside the supporting unit 2 so that the test tray 200 does not protrude out of the supporting unit 2.

Figure 10:
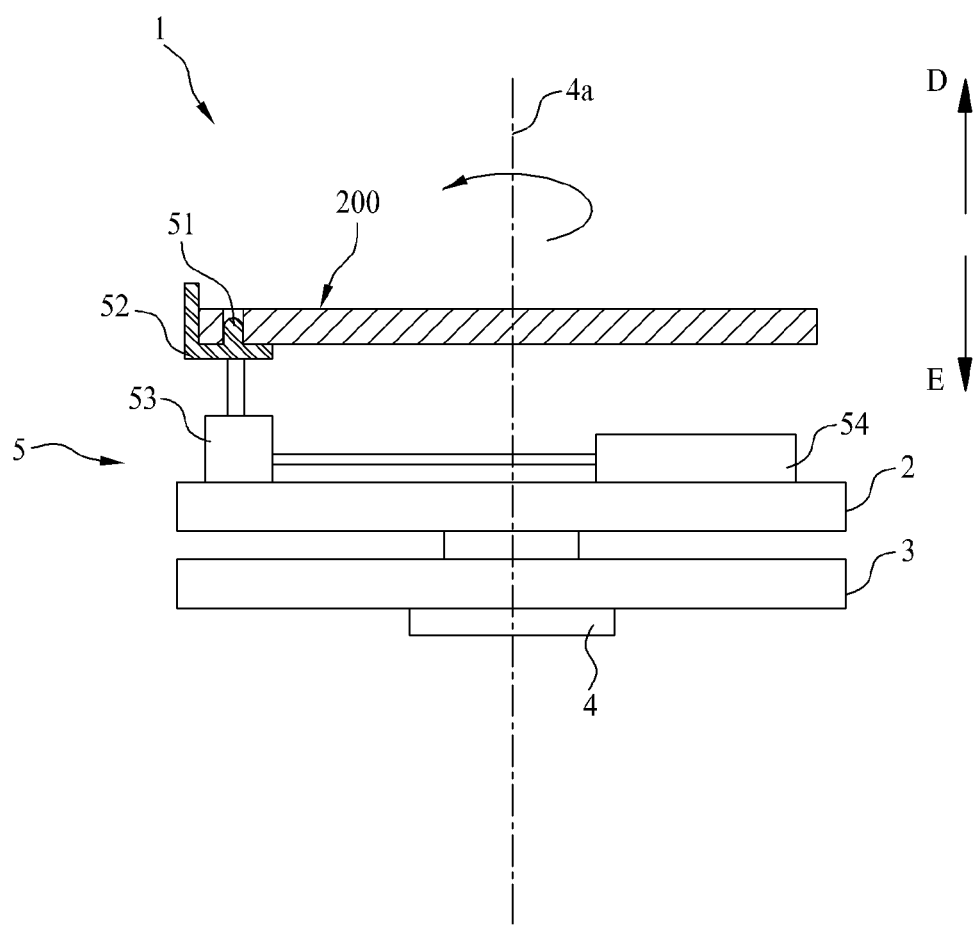

Then, if the test tray 200 is positioned at the spinning position, as shown in FIG. 10, the spinning unit 4 spins the supporting unit 2. Accordingly, the test tray 200 spins in the direction enabling to test the semiconductor devices at the same arrangement in each of the first chamber unit 111 and the second chamber unit 112. For example, the spinning unit 4 may spin the supporting unit 2 at an angle of 180° with respect to the spinning axis 4a. When the spinning unit 4 spins the supporting unit 2, the elevating module 53 maintains the elevating member 52 in its state being raised, whereby the inserting member 51 is maintained in its state being inserted into the transferring groove 210. Accordingly, the inserting member 51 and the supporting member 522 prevent the detachment of test tray 200 by a centrifugal force.

Figure 11:
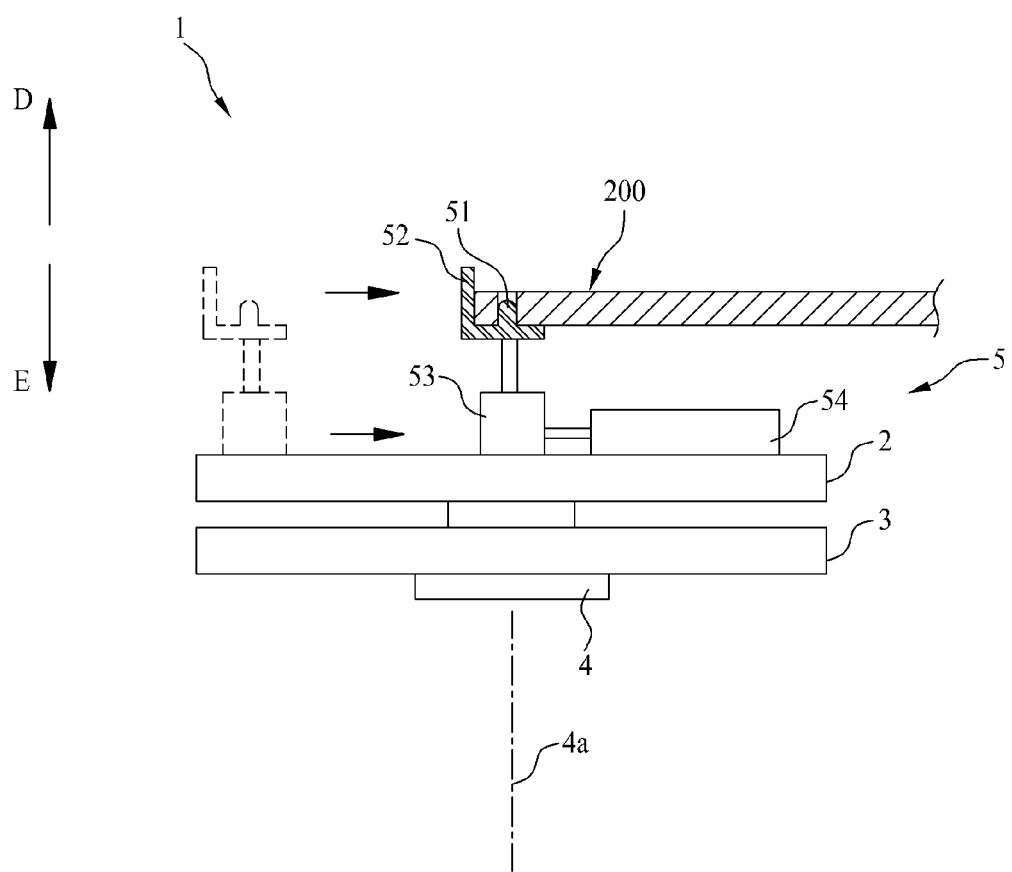

If the test tray 200 spins, as shown in FIG. 11, the driving unit 54 moves the elevating module 53 so as to transfer the test tray 200 from the spinning position to the carrying-out position. Accordingly, the test tray 200 is provided at the position enabling to unload the test tray 200 from the supporting unit 2 by the use of second conveyor module 132 (See FIG. 4).

Figure 12:
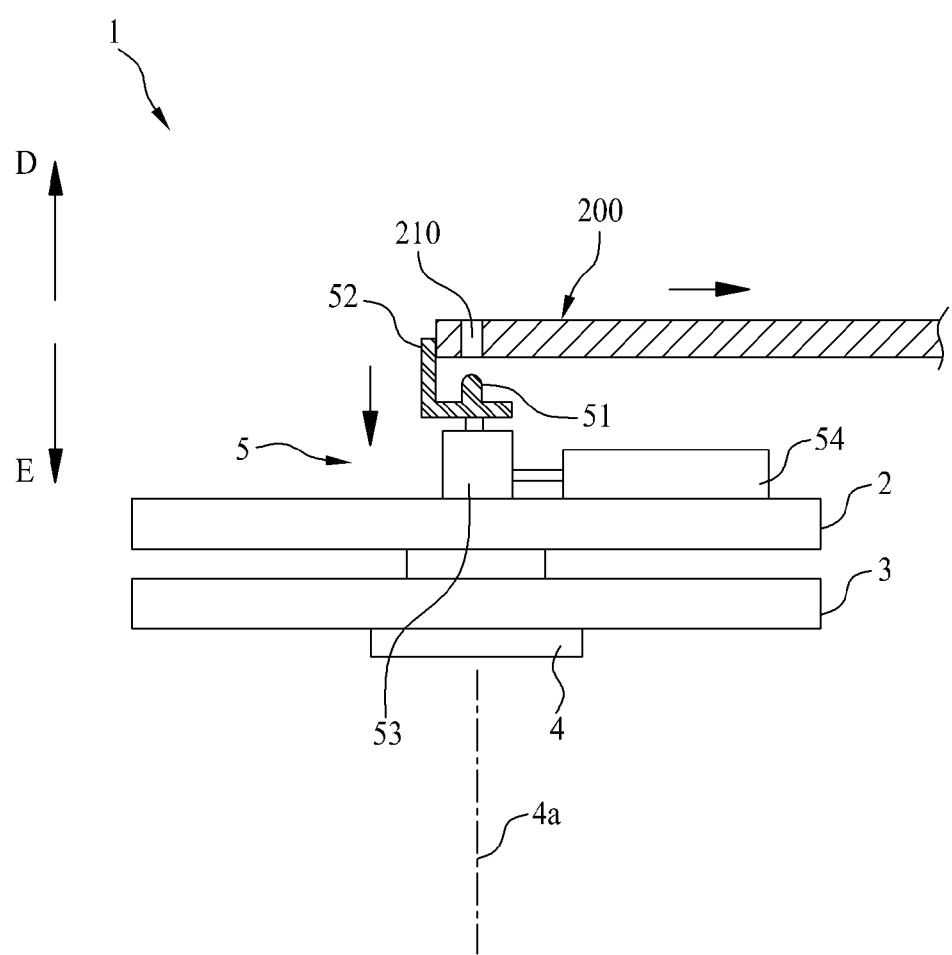

Then, if the test tray 200 is positioned at the carrying-out position, as shown in FIG. 12, the elevating module 53 lowers the elevating member 52. Accordingly, the inserting member 51 is detached from the transferring groove 210. If the inserting member 51 is detached from the transferring groove 210, the second conveyor module 132 (See FIG. 3) may transport the test tray 200 so as to unload the test tray 200 from the supporting unit 2.

If the test tray 200 is unloaded from the supporting unit 2, as shown in FIG. 7, the spinning unit 4 spins the supporting unit 2 so that another test tray 200 unloaded from the first conveyor module 131 (See FIG. 4) is loaded. The spinning unit 4 makes the supporting unit 2 wait without spinning so that another test tray 200 unloaded from the second conveyor module 132 (See FIG. 3) is loaded.

Figure 13:
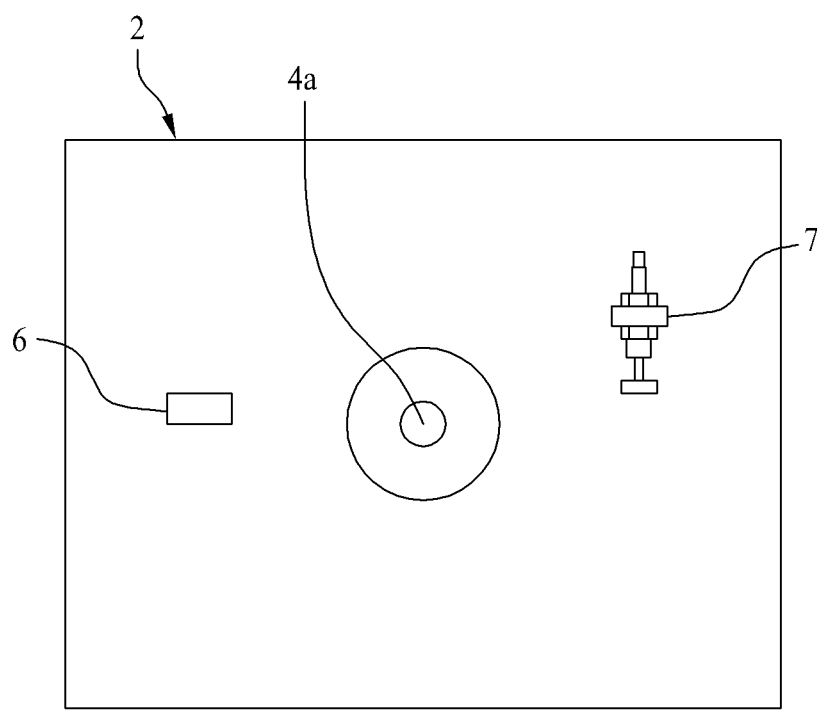
FIGS. 13 and 14 are bottom views for explaining an operation of an absorbing unit according to the present invention.
Figure 14:
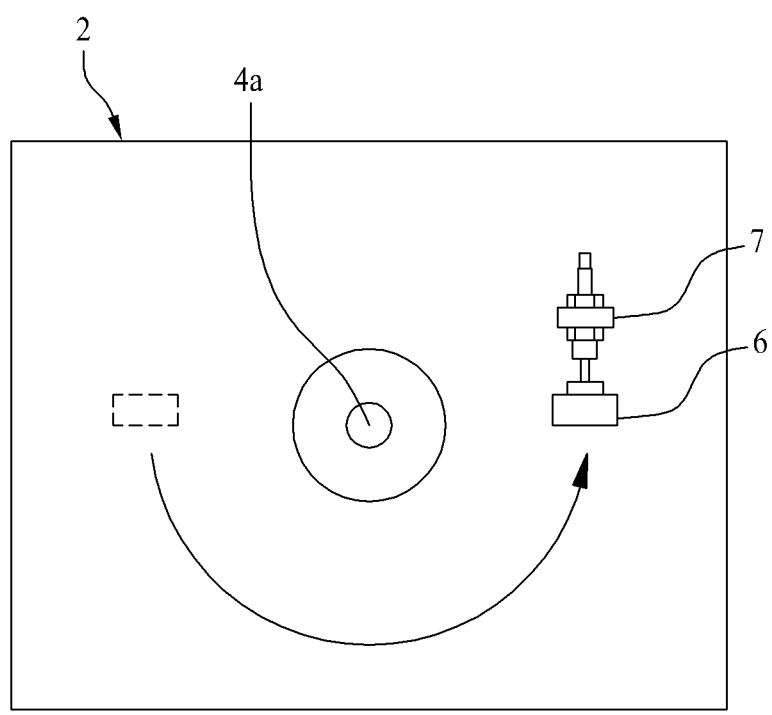
Figure 15:
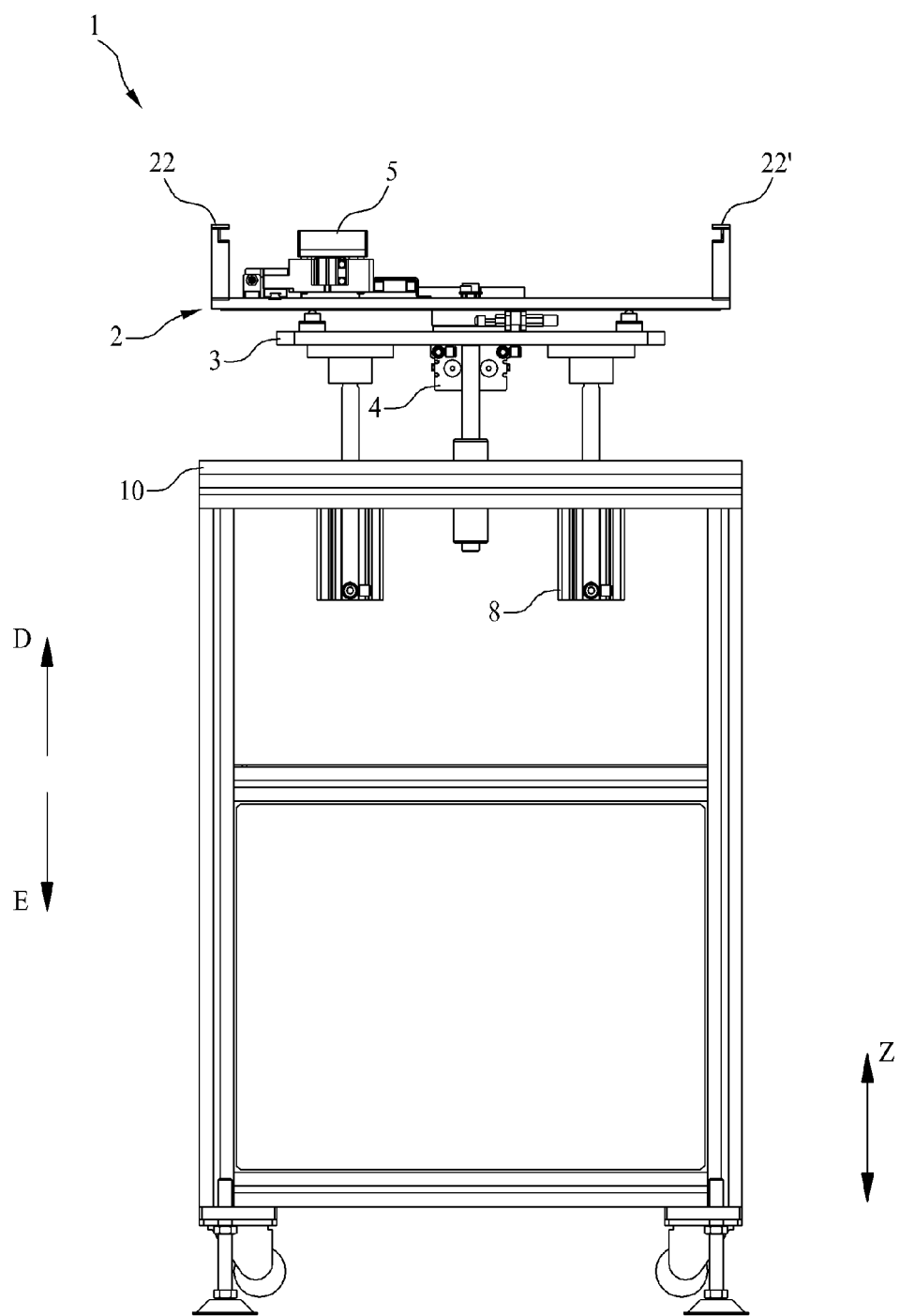
FIGS. 15 and 16 are lateral views for illustrating an apparatus for spinning a test tray, which includes an elevating unit according to the present invention.
Figure 16:
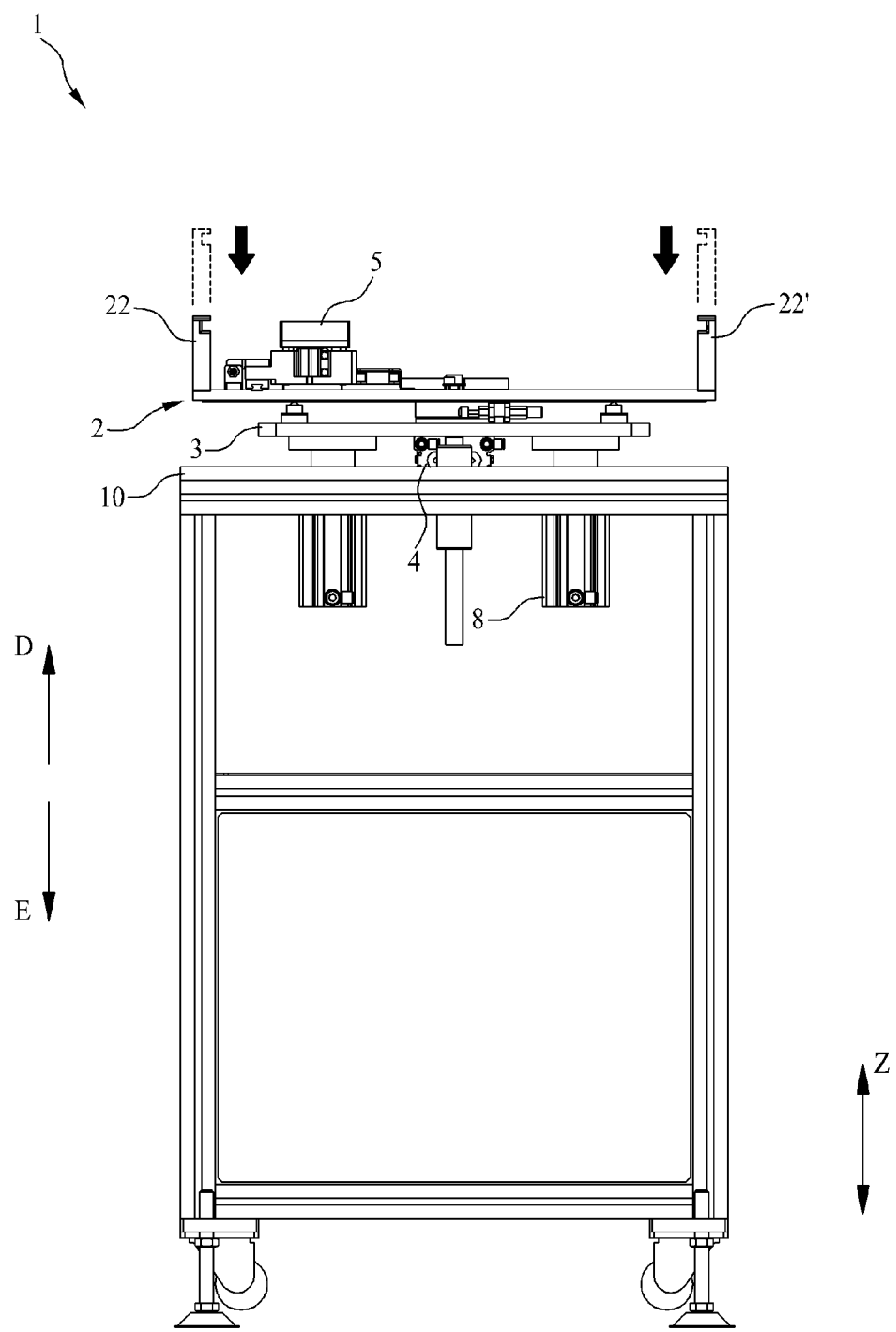

Referring to FIGS. 6, 13 and 14, the apparatus 1 for spinning a test tray according to the present invention may further include a protruding member 6 (See FIG. 13) formed in the supporting unit 2, and an absorbing unit 7 connected with the base unit 3 (See FIG. 6).

The protruding member 6 protrudes from the supporting unit 2 in a lower direction (E arrow direction, See FIG. 6) from the supporting unit 2 toward the base unit 3. That is, the protruding member 6 is positioned between the supporting unit 2 and the base unit 3. When the spinning unit 4 spins the supporting unit 2 so as to spin the test tray 200, and then the supporting unit 2 which spins is stopped, the protruding member 6 is provided at the position being in contact with the absorbing unit 7. The protruding member 6 is formed in a rectangular parallelepiped, but not limited to this shape. The protruding member 6 may be formed in any shape capable of being in contact with the absorbing unit 7, for example, disk shape.

The absorbing unit 7 elastically supports the protruding member 6 during the process for spinning and stopping the supporting unit 2 by the use of spinning unit 4 so that it is possible to absorb an impact applied to the supporting unit 2 and the test tray 200 supported by the supporting unit 2. Furthermore, the absorbing unit 7 enables to prevent the semiconductor devices received in the test tray 200 from being detached from the test tray 200 by vibration or shaking. The absorbing unit 7 may include an elasticity member (not shown) for elastically supporting the protruding member 6, wherein the elasticity member (not shown) may be a spring. The absorbing unit 7 is connected with one surface facing from the base unit 3 toward the supporting unit 2. That is, the absorbing unit 7 is positioned between the supporting unit 2 and the base unit 3.

If the spinning unit 4 makes the test tray 200, which is supported by the supporting unit 2, spin at an angle of 180°, the absorbing unit 7 elastically supports the protruding member 6 which spins at an angle of 180° in accordance with the supporting unit 2 which spins at an angle of 180°. If the spinning unit 4 makes the test tray 200, which is supported by the supporting unit 2, spin at an angle of 90°, the absorbing unit 7 elastically supports the protruding member 6 which spins at an angle of 90° in accordance with the supporting unit 2 which spins at an angle of 90°.

Referring to FIGS. 15 to 18, the apparatus 1 for spinning a test tray according to the present invention may further include an elevating unit 8 (See FIG. 15) for elevating the supporting unit 2.

The elevating unit 8 may be connected with the main body 10. The base unit 3 may be connected with the elevating unit 8. According as the elevating unit 8 elevates the base unit 3, the supporting unit 2 may be elevated. According as the elevating unit 8 elevates the base unit 3, it is possible to elevate the supporting unit 2, the spinning unit 4 and the transferring unit 5.

The elevating unit 8 may elevate the base unit 3 by a cylinder method using hydraulic cylinder or pneumatic cylinder, a ball screw method using motor and ball screw, a gear method using motor, rack gear and pinion gear, a belt method using motor, pulley and belt, or a linear motor using coil and permanent magnet. If the elevating unit 8 elevates the base unit 3 by the cylinder method, the base unit 3 is connected with a cylinder rod, whereby the base unit 3 is elevated in accordance with a movement of the cylinder rod. Although not shown, the elevating unit 8 may be directly connected with the supporting unit 2, and the supporting unit 2 may be elevated.

In this case, each of the first conveyor module 131 (See FIG. 17) and the second conveyor module 132 (See FIG. 17) may include a plurality of conveyors 130a (See FIG. 17) for transporting the test tray 200.

The first conveyor module 131 may include the plurality of conveyors 130a provided at fixed intervals in the vertical direction (Z-axis direction). Accordingly, the first conveyor module 131 may individually transport the plurality of test trays 200 in accordance with a plurality of transporting paths formed in the vertical direction (Z-axis direction). For example, the first conveyor module 131 may include the conveyor 130a for transporting the test tray 200 in accordance with a first transporting path P1 (See FIG. 17), and the conveyor 130a for transporting the test tray 200 in accordance with a second transporting path P2 (See FIG. 17). The second transporting path P2 is provided in the lower direction (E arrow direction) in comparison to the first transporting path P1. In this case, under the circumstance that the test tray 200 is stopped by the conveyor 130a for forming the first transporting path P1, the conveyor 130a for forming the second transporting path P2 may be operated to transport the test tray 200.

The second conveyor module 132 may include the plurality of conveyors 130a provided at fixed intervals in the vertical direction (Z-axis direction). Accordingly, the second conveyor module 132 may individually transport the plurality of test trays 200 in accordance with a plurality of transporting paths formed in the vertical direction (Z-axis direction). For example, the second conveyor module 132 may include the conveyor 130a for transporting the test tray 200 in accordance with the first transporting path P1, and the conveyor 130a for transporting the test tray 200 in accordance with the second transporting path P2. In this case, under the circumstance that the test tray 200 is stopped by the conveyor 130a for forming the first transporting path P1, the conveyor 130a for forming the second transporting path P2 may be operated to transport the test tray 200.

The elevating unit 8 may elevate the supporting unit 2 so as to adjust a height of the test tray 200 transferred between the supporting unit 2 and the conveyor unit 130 (See FIG. 4). In this case, according as the elevating unit 8 elevates the base unit 3, the supporting unit 2 is elevated. Thus, the apparatus 1 for spinning a test tray according to the present invention can change the transporting path of the test tray 200 transported between the first conveyor module 131 and the second conveyor module 132.

Figure 17:
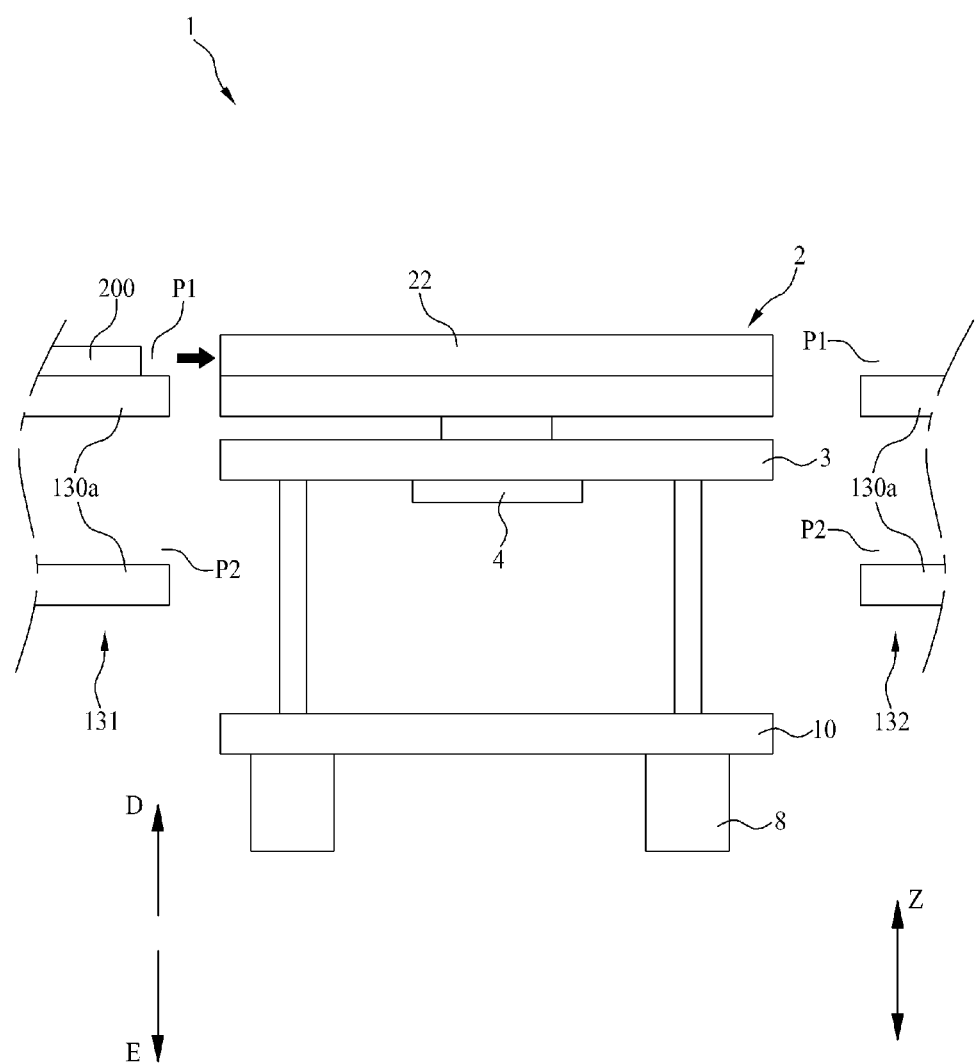
FIGS. 17 and 18 are lateral views for illustrating an operation for changing a transporting path of a test tray by an apparatus for spinning a test tray according to the present invention.

For example, as shown in FIG. 17, the test tray 200 transported along the first transporting path P1 in the first conveyor module 131 may be transferred to the supporting unit 2 positioned at the height corresponding to the first transporting path P1. In this case, the elevating unit 8 elevates the base unit 3 so that the supporting unit 2 is positioned at the height corresponding to the first transporting path P1. The test tray 200 is transferred from the conveyor 130a of the first conveyor module 131 for forming the first transporting path P1 to the supporting unit 2 positioned at the height corresponding to the first transporting path P1, whereby the test tray 200 is supported by the guiding member 22 of the supporting unit 2.

Figure 18:
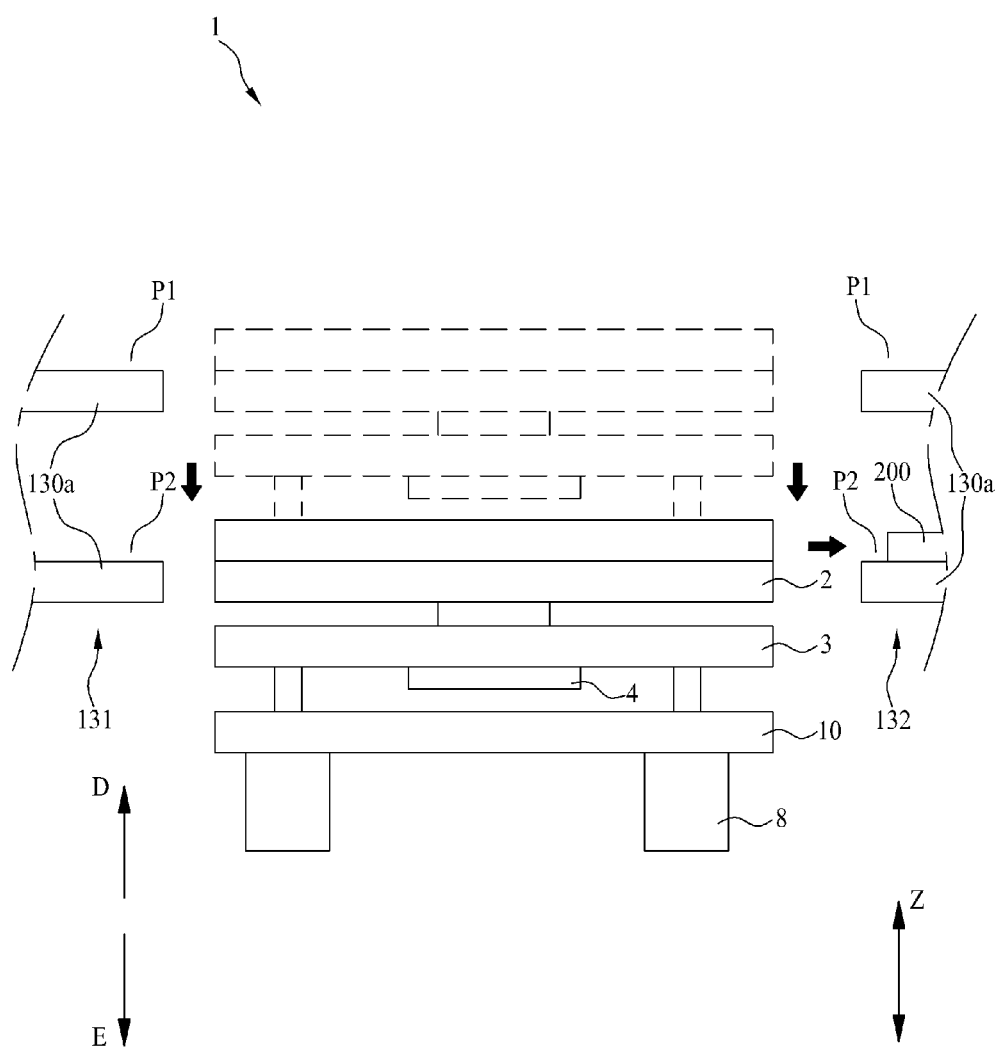

If the test tray 200 is supported by the supporting unit 2, the elevating unit 8 elevates the base unit 3 so that it is possible to adjust the height of the test tray 200 supported by the supporting unit 2. For example, as shown in FIG. 18, the elevating unit 8 may lower the base unit 3 so as to make the supporting unit 2 positioned at the height corresponding to the second transporting path P2. Accordingly, the test tray 200 supported by the supporting unit 2 may be lowered to the height corresponding to the second transporting path P2. The test tray 200 may be transferred from the supporting unit 2 positioned at the height corresponding to the second transporting path P2 to the conveyor 130a of the second conveyor module 132 for forming the second transporting path P2. Accordingly, the apparatus 1 for spinning a test tray according to the present invention may change the transporting path of the test tray 200, which is transferred from the first conveyor module 131 to the second conveyor module 132, from the first transporting path P1 to the second transporting path P2.

Although not shown, the apparatus 1 for spinning a test tray according to the present invention may change the transporting path of the test tray 200, which is transferred from the first conveyor module 131 to the second conveyor module 132, from the second transporting path P2 to the first transporting path P1. Also, the apparatus 1 for spinning a test tray according to the present invention may change the transporting path of the test tray 200, which is transferred from the second conveyor module 132 to the first conveyor module 131, between the first transporting path P1 and the second transporting path P2. The apparatus 1 for spinning a test tray according to the present invention may transfer the test tray 200, maintained in its transporting path, between the first conveyor module 131 and the second conveyor module 132, without changing the transporting path of the test tray 200 transferred between the first conveyor module 131 and the second conveyor module 132.

Hereinafter, the in-line test handler according to the embodiments of the present invention will be described in detail as follows.

Figure 19:
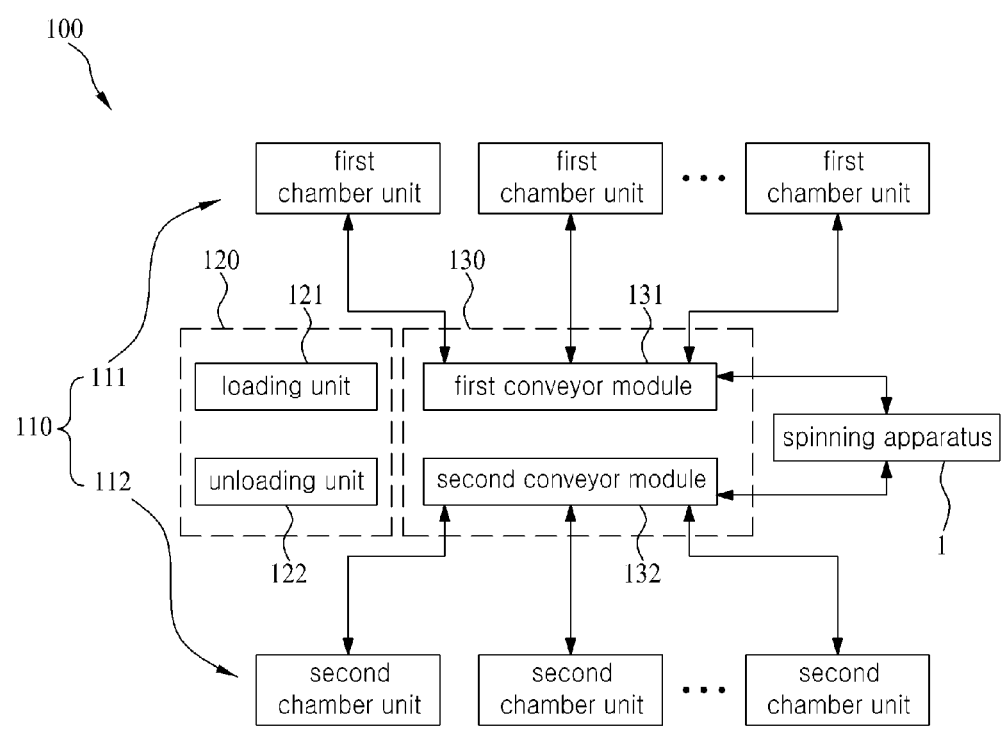
FIG. 19 is a block diagram for illustrating an in-line test handler according to the present invention.

Referring to FIGS. 4 and 19, the in-line test handler 100 according to the present invention may include the chamber units 110, the sorting unit 120, the conveyor unit 130 and the apparatus 1 for spinning a test tray (hereinafter, referred to as 'spinning apparatus'). The spinning apparatus 1 is the same as the aforementioned apparatus 1 for spinning a test tray according to the present invention, whereby a detailed description for the spinning apparatus 1 will be omitted.

The sorting unit 120 carries out the loading process and the unloading process. Each of the chamber units 110 carries out the testing process. The plurality of chamber units 110 are provided along the conveyor unit 130. The sorting unit 120 and the chamber units 110, provided at a predetermined interval from each other, are connected in-line by the conveyor unit 130. Accordingly, the in-line test handler 100 according to the present invention is embodied in such a manner that the respective chamber units 110 carry out the testing process independently of the loading process and the unloading process by the sorting unit 120. Thus, the in-line test handler 100 according to the present invention may promote the following efficiency.

First, in case of the in-line test handler 100 according to the present invention, even though any one of the chamber units 110 and the sorting unit 120 has problems, the remaining units except one having problems are normally driven for performing the corresponding work. Thus, even if any one of the chamber units 110 and the sorting unit 120 has problems, the in-line test handler 100 according to the present invention prevents the entire system from being stopped, to thereby prevent loss of working time.

Second, the in-line test handler 100 according to the present invention efficiently distributes the test tray 200 by the conveyor unit 130 in consideration of time consumed for carrying out each of the loading process, the unloading process and the testing process. Thus, it is possible to improve the operational ratio of apparatuses by the use of in-line test handler 100 according to the present invention. Also, the in-line test handler 100 according to the present invention enables to test the semiconductor devices of the test tray 200 at the same arrangement in each of the chamber units 110 by the use of spinning apparatus 1 so that it is possible to efficiently distribute the test tray 200 by the conveyor unit 130 regardless of the direction of the chamber units 110 in consideration of time consumed for carrying out each of the loading process, the unloading process and the testing process. Thus, it is possible to improve the operational ratio of apparatuses by the use of in-line test handler 100 according to the present invention.

Third, the in-line test handler 100 according to the present invention enables to test the semiconductor devices of the test tray 200 at the same arrangement in each of the chamber units 110 by the use of spinning apparatus 1 so that it is possible to remove restrictions on providing the chamber units 110 in the same direction. Accordingly, the in-line test handler 100 according to the present invention enables to improve easiness of working and degree of freedom on the process for arranging the chamber units 110. Also, the in-line test handler 100 according to the present invention is embodied to realize a minimum movement of the test tray 200 between the sorting unit 120 and the chamber units 110.

Fourth, the in-line test handler 100 according to the present invention enables to re-arrange the chamber unit 110 regardless of direction when a processing line is expanded or reduced by adding or removing the chamber unit 110, to thereby improve easiness in working for expanding or reducing the processing line.

Fifth, in case of the in-line test handler 100 according to the present invention, the sorting unit 120 is separately provided from the chamber units 110 so that it is possible to decrease the number of structures or devices provided in the sorting unit 120. Accordingly, the in-line test handler 100 according to the present invention enables to reduce a jam rate for the sorting unit 120. Thus, the in-line test handler 100 according to the present invention enables to reduce time for stopping the sorting unit 120 in accordance with jam of the sorting unit 120, to thereby increase working time of the sorting unit 120.

Hereinafter, the chamber unit 110, the sorting unit 120 and the conveyor unit 130 will be described in detail as follows.

Figure 20:
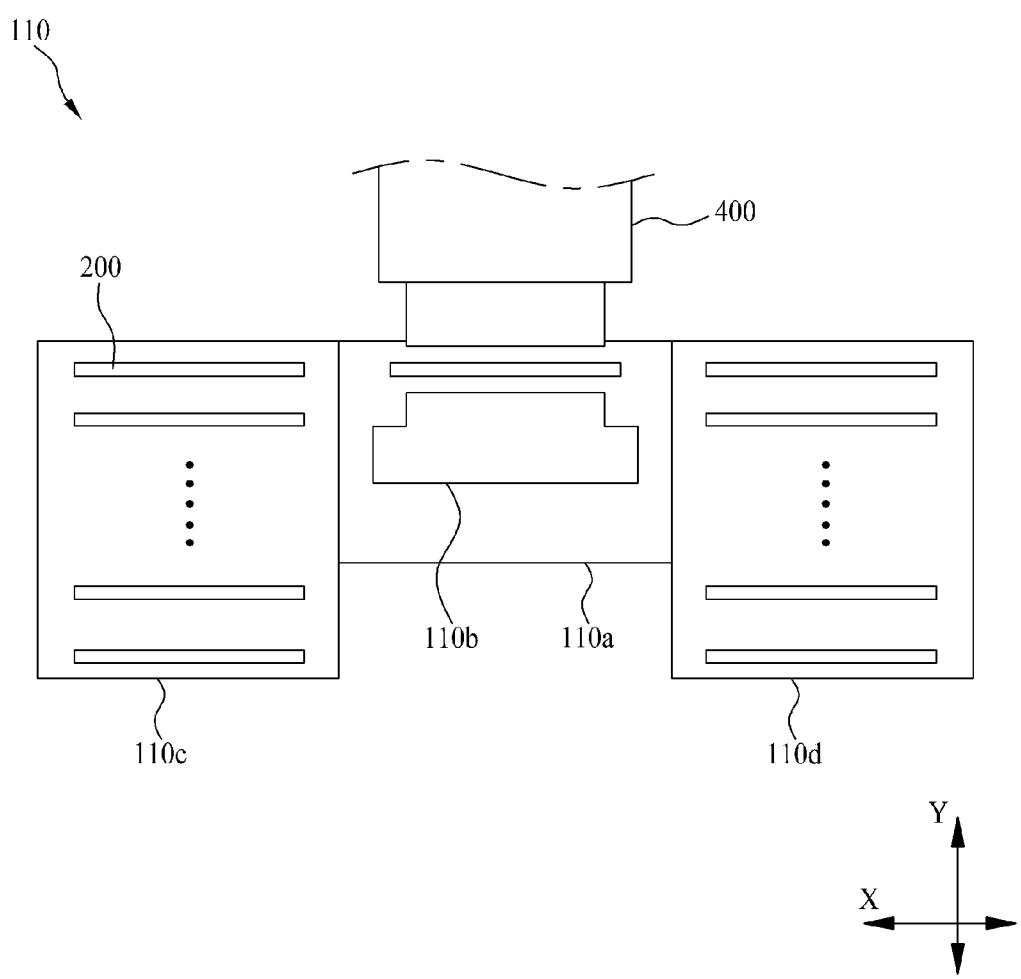
FIG. 20 is a plane view for illustrating a chamber unit according to the present invention.

Referring to FIGS. 19 and 20, the chamber unit 110 carries out the testing process. The chamber unit 110 brings the semiconductor devices received in the test tray 200 into contact with a testing device 400 (See FIG. 20), to thereby carry out the testing process. According as the semiconductor device is brought into contact with the testing device 400, the testing device 400 is electrically connected with the semiconductor device, whereby the testing process for the semiconductor device is carried out. The test tray 200 may receive the plurality of semiconductor devices therein. In this case, the chamber unit 110 makes the plurality of semiconductor devices bring into contact with the testing device 400, whereby the plurality of semiconductor devices are tested by the testing device 400. The testing device 400 may include a hi-fix board.

The chamber unit 110 may include a first chamber 110a (See FIG. 20) for the testing process. The first chamber 110a is provided with the testing device 400. If the semiconductor devices received in the test tray 200 are brought into contact with test sockets, the semiconductor devices being in contact with the test sockets are tested by the testing device 400.

The chamber unit 110 may include a contacting unit 110b (See FIG. 20) for bring the test tray 200 into contact with the testing device 400. The contacting unit 110b is provided in the first chamber 110a. The contacting unit 110b brings the semiconductor devices received in the test tray 200 into contact with the testing device 400.

Referring to FIGS. 19 to 22, the chamber unit 110 may further include a second chamber 110c and a third chamber 110d.

The second chamber 110c adjusts the semiconductor devices received in the test tray 200 to a first temperature. The semiconductor device to be tested is received in the test tray 200 positioned in the second chamber 110c by the use of sorting unit 120. The test tray 200 positioned in the second chamber 110c is transported to the chamber unit 110 by the use of conveyor unit 130 (See FIG. 19), and is then transferred to the second chamber 110c. The first temperature corresponds to a temperature range of the semiconductor devices to be tested when the semiconductor devices to be tested are tested by the testing device 400. The second chamber 110c may include at least one of electric heater and liquid nitrogen spraying system to adjust the semiconductor device to be tested to the first temperature. When the semiconductor device to be tested is adjusted to the first temperature, the test tray 200 is transferred from the second chamber 110c to the first chamber 110a.

The third chamber 110d adjusts the semiconductor device received in the test tray 200 to a second temperature. The semiconductor device tested by the testing process is received in the test tray 200 positioned in the third chamber 110d. The test tray 200 positioned in the third chamber 110d is transferred from the first chamber 110a. The second temperature corresponds to a temperature range of room temperature or adjacent temperature. The third chamber 110d may include at least one of electric heater and liquid nitrogen spraying system to adjust the tested semiconductor device to the second temperature. When the tested semiconductor device is adjusted to the second temperature, the test tray 200 is transferred to the conveyor unit 130.

Although not shown, the chamber unit 110 may include a transferring means (not shown) to transfer the test tray 200. The transferring means may transfer the test tray 200. The transferring means may transfer the test tray 200 by pushing or pulling. The transferring means may transfer the test tray 200 with the semiconductor device to be tested from the second chamber 110c to the first chamber 110a. Transferring means may transfer the test tray 200 with the tested semiconductor device from the first chamber 110a to the third chamber 110d. The transferring means may transfer the test tray 200 by a cylinder method using hydraulic cylinder or pneumatic cylinder, a ball screw method using motor and ball screw, a gear method using motor, rack gear and pinion gear, a belt method using motor, pulley and belt, or a linear motor using coil and permanent magnet.

Figure 21:
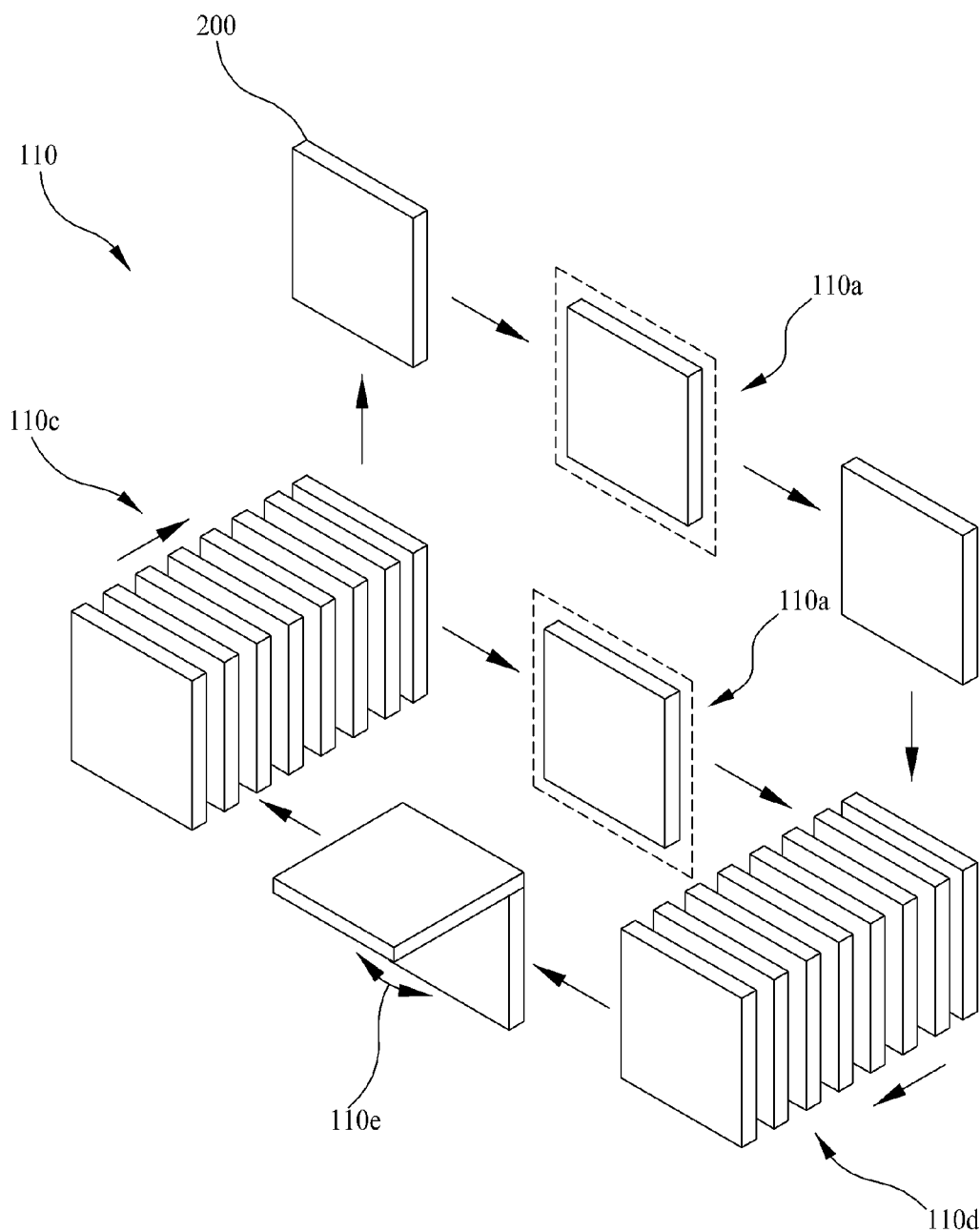
FIGS. 21 and 22 are concept views for explaining embodiments of chamber unit according to the present invention.

Referring to FIG. 21. the chamber unit 110 may be provided with the second chamber 110c, the first chamber 110a and the third chamber 110d arranged in parallel. In this case, the chamber unit 110 may include the plurality of first chambers 110a. The plurality of first chambers 110a may be deposited in the vertical direction.

Figure 22:
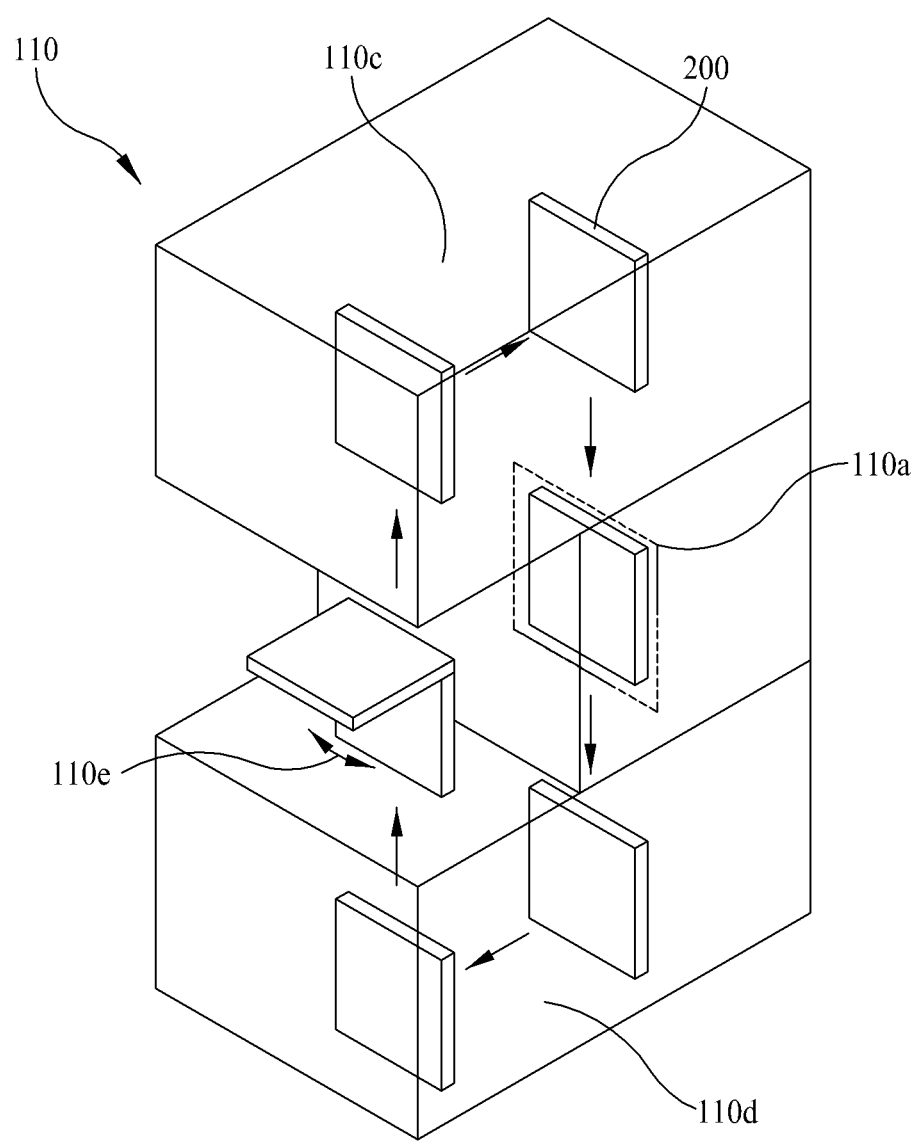
Figure 23:
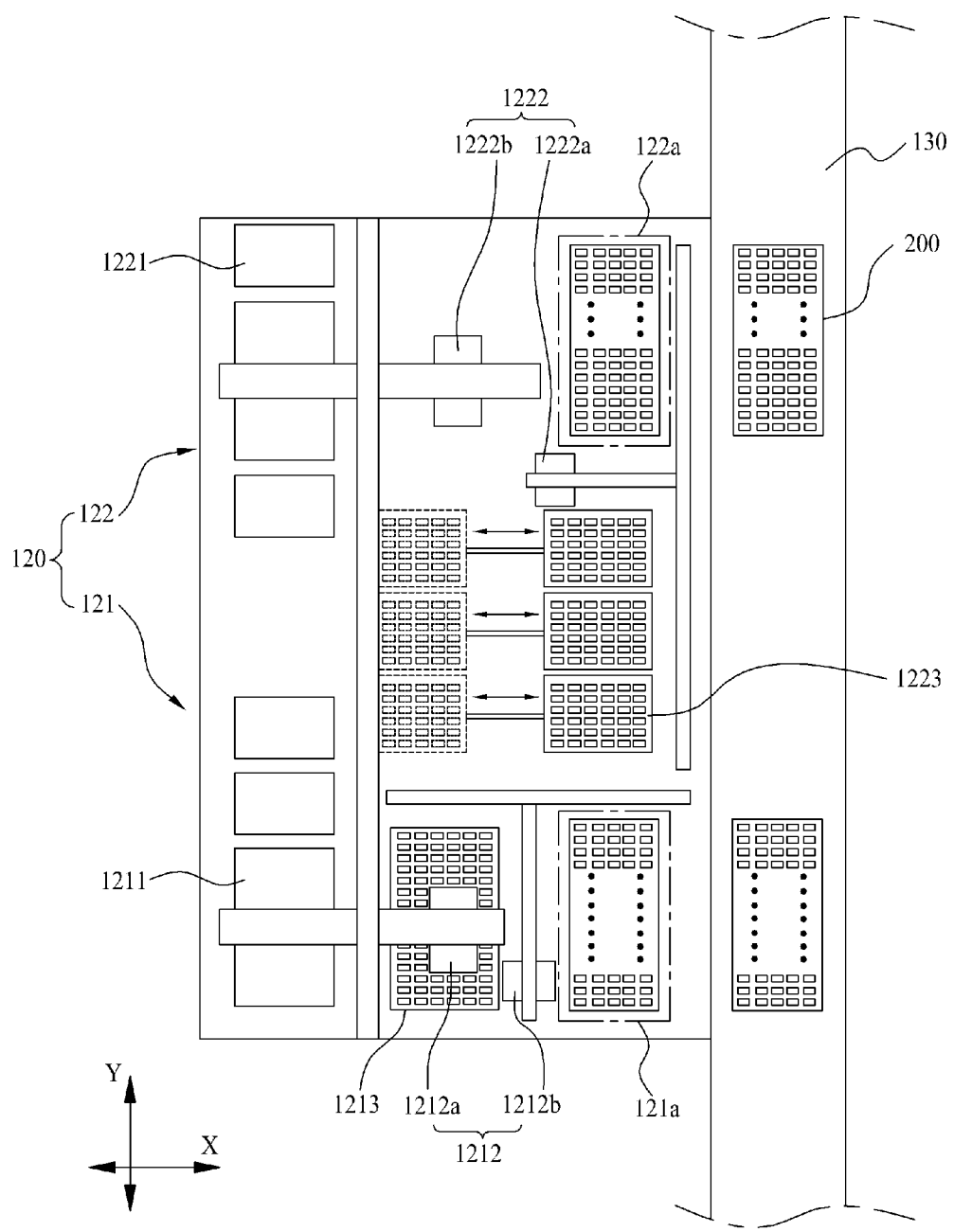
FIG. 23 is a plane view for illustrating a sorting unit according to the present invention.

As shown in FIG. 22, the chamber unit 110 may be provided with the second chamber 110c, the first chamber 110a and the third chamber 110d deposited in the vertical direction. That is, the second chamber 110c, the first chamber 110a and the third chamber 110d may be provided in the vertical direction. The second chamber 110c may be provided above the first chamber 110a, and the third chamber 110d may be provided below the first chamber 110a.

Referring to FIGS. 19 to 22, the chamber unit 110 may include a rotating unit 110e (See FIG. 21) for rotating the test tray 200 between the horizontal state and the vertical state.

The rotating unit 110e is provided in the chamber unit 110. The rotating unit 110e may rotate the test tray 200 with the semiconductor device to be tested from the horizontal state to the vertical state. Accordingly, the first chamber 110a may carry out the testing process for the test tray 200 being in the vertical state. Also, the sorting unit 120 may carry out the loading process for the test tray 200 being in the horizontal state. The rotating unit 110e may rotate the test tray 200 with the tested semiconductor device from the vertical state to the horizontal state. Accordingly, the sorting unit 120 may carry out the unloading process for the test tray 200 being in the horizontal state.

As shown in FIGS. 21 and 22, the chamber unit 110 may include one rotating unit 110e. In this case, the rotating unit 110e may be provided between the second chamber 110c and the third chamber 110d. The test tray 200 with the semiconductor device to be tested is rotated by the rotating unit 110, whereby the test tray 200 with the semiconductor device to be tested is in the vertical state. After that, the test tray 200 being in the vertical state is transferred from the rotating unit 110e to the second chamber 110c by the use of transferring means. The test tray 200 with the tested semiconductor device is transferred from the third chamber 110d to the rotating unit 110e, and is rotated to be in the horizontal state by the use of rotating unit 110e.

Although not shown, the chamber unit 110 may include a first rotating unit for rotating the test tray 200 with the semiconductor device to be tested, and a second rotating unit for rotating the test tray 200 with the tested semiconductor device. The first rotating unit may be provided inside or outside the second chamber 110c. The second rotating unit may be provided inside or outside the third chamber 110d.

Although not shown, the chamber unit 110 may carry out the testing process for the test tray 200 being in the horizontal state without using the rotating unit 110e. In this case, while the test tray 200 being in the horizontal state is transferred among the second chamber 110c, the first chamber 110a and the third chamber 110d, the testing process is carried out.

Referring to FIGS. 3, 4 and 19, the transferring means may transfer the test tray 200 supported by the conveyor unit 130 to the chamber unit 110. The transferring means may transfer the test tray 200 supported by the conveyor unit 130 to the first chamber 110a. If the chamber unit 110 includes the second chamber 110c, the transferring means may transfer the test tray 200 supported by the conveyor unit 130 to the first chamber 110a via the second chamber 110c.

The transferring means may transfer the test tray 200 which completes the testing process to the conveyor unit 130. The transferring means may transfer the test tray 200 which completes the testing process from the first chamber 110a to the conveyor unit 130. If the chamber unit 110 includes the third chamber 110d, the transferring means may transfer the test tray 200 which completes the testing process from the first chamber 110a to the conveyor unit 130 via the third chamber 110d.

Referring to FIGS. 3, 4 and 19, the plurality of chamber units 110 may be provided along the conveyor unit 130. The in-line test handler 100 according to the present invention may include the first chamber unit 111 and the second chamber unit 112 facing in the different directions.

The first chamber unit 111 is connected in-line with the sorting unit 120 by the use of first conveyor module 131. The transferring means of the first chamber unit 111 may transfer the test tray 200 supported by the first conveyor module 131 to the first chamber 110a (See FIG. 20). The transferring means of the first chamber unit 111 may transfer the test tray 200 supported by the first conveyor module 131 to the first chamber 110a (See FIG. 20) via the second chamber 110c (See FIG. 20).

The transferring means of the first chamber unit 111 may transfer the test tray 200 which completes the testing process to the first conveyor module 131. The transferring means of the first chamber unit 111 may transfer the test tray 200 which completes the testing process from the first chamber 110a (See FIG. 2) to the first conveyor module 131. The transferring means of the first chamber unit 111 may transfer the test tray 200 which completes the testing process from the first chamber 110a (See FIG. 20) to the first conveyor module 131 via the third chamber 110d (See FIG. 20).

The in-line test handler 100 according to the present invention may include the plurality of first chamber units 111. In this case, the plurality of first chamber units 111 may be provided at fixed intervals in the first axis direction (X-axis direction) along the first conveyor modules 131.

Referring to FIGS. 3, 4 and 19, the second chamber unit 112 may be connected in-line with the sorting unit 120 by the use of second conveyor module 132. The transferring means of the second chamber unit 112 may transfer the test tray 200 supported by the second conveyor module 132 to the first chamber 110a (See FIG. 20). The transferring means of the second chamber unit 112 may transfer the test tray 200 supported by the second conveyor module 132 to the first chamber 110a (See FIG. 20) via the second chamber 110c (See FIG. 20).

The transferring means of the second chamber unit 112 may transfer the test tray 200 which completes the testing process to the second conveyor module 132. The transferring means of the second chamber unit 112 may transfer the test tray 200 which completes the testing process from the first chamber 110a (See FIG. 20) to the second conveyor module 132. The transferring means of the second chamber unit 112 may transfer the test tray 200 which completes the testing process from the first chamber 110a (See FIG. 20) to the second conveyor module 132 via the third chamber 110d (See FIG. 20).

The in-line test handler 100 according to the present invention may include the plurality of second chamber units 112. In this case, the plurality of second chamber units 112 may be provided at fixed intervals in the first axis direction (X-axis direction) along the second conveyor modules 132. The second chamber units 112 and the first chamber units 111 may be provided at fixed intervals in the second axis direction (Y-axis direction) being in perpendicular to the first axis direction (X-axis direction). In this case, the first conveyor module 131 and the second conveyor module 132 may be provided at a predetermined interval from each other in the second axis direction (Y-axis direction). The spinning apparatus 1 may be provided between the first conveyor module 131 and the second conveyor module 132 so that the first conveyor module 131 and the second conveyor module 132 may be connected in-line with each other.

The second chamber unit 112 and the first chamber unit 111 may carry out the testing process for the semiconductor device at the different temperatures. For example, the first chamber unit 111 tests the semiconductor device under high-temperature circumstances, and the second chamber unit 112 tests the semiconductor device under low-temperature circumstances. In this case, the conveyor unit 130 transports the test tray 200 to the first chamber unit 111 so as to test the semiconductor device under high-temperature circumstances, and then transports the test tray 200, which is unloaded from the first chamber unit 111 after completing the testing process, to the second chamber unit 112, so as to test the semiconductor device under low-temperature circumstances. The conveyor unit 130 may firstly transport the test tray 200 to the second chamber unit 112 so as to test the semiconductor device under low-temperature circumstance, and then transport the test tray 200, which is unloaded from the second chamber unit 112 after completing the testing process, to the first chamber unit 111 so as to test the semiconductor device under high-temperature circumstances. During this process, the spinning apparatus 1 may spin the test tray 200 transported between the first chamber unit 111 and the second chamber unit 112 so as to test the semiconductor devices received in the test tray 200 at the same arrangement in each of the first chamber unit 111 and the second chamber unit 112.

Referring to FIGS. 3, 4, 19 and 23, the sorting unit 120 may carry out the loading process and the unloading process. The sorting unit 120 may be provided at a predetermined interval from the chamber units 110. The sorting unit 120 may include a loading unit 121 (See FIG. 23) for carrying out the loading process.

The loading unit 121 transfers the semiconductor device to be tested from a customer tray to the test tray 200. The loading unit 121 may include a loading stacker 1211 (See FIG. 23) and a loading picker 1212 (See FIG. 23).

The loading stacker 1211 supports the customer tray. The customer tray supported by the loading stacker 1211 receives the semiconductor devices to be tested therein. The loading stacker 1211 may store the plurality of customer trays with the semiconductor devices to be tested. The customer trays being deposited in the vertical direction may be stored in the loading stacker 1211.

The loading picker 1212 may pick up the semiconductor device to be tested from the customer tray positioned at the loading stacker 1211, and receive the semiconductor device to be tested in the test tray 200. When the semiconductor device to be tested is received in the test tray 200, the test tray 200 may be positioned at a loading position 121a (See FIG. 23). While the loading picker 1212 moves in the first axis direction (X-axis direction) and the second axis direction (Y-axis direction), the loading picker 1212 may transfer the semiconductor device to be tested. The loading picker 1212 may be elevated.

The loading unit 121 may further include a loading buffer 1213 (See FIG. 23) for temporarily receiving the semiconductor device to be tested. In this case, the loading picker 1212 picks up the semiconductor device to be tested from the customer tray, and receives the picked-up semiconductor device in the test tray 200 positioned at the loading position 121a via the loading buffer 1213. The loading picker 1212 may include a first loading picker 1212a (See FIG. 23) for transferring the semiconductor device to be tested from the customer tray to the loading buffer 1213, and a second loading picker 1212b (See FIG. 23) for transferring the semiconductor device to be tested from the loading buffer 1213 to the test tray 200.

Although not shown, the loading unit 121 may include a loading transferring means for transferring the test tray 200. The loading transferring means may transfer the test tray 200 by pushing or pulling. The loading transferring means may transfer the test tray 200 which completes the loading process from the loading position 121a to the conveyor unit 130. The loading transferring means may transfer the vacant test tray 200 from the conveyor unit 130 to the loading position 121a. The loading transferring means may transfer the test tray 200 by a cylinder method using hydraulic cylinder or pneumatic cylinder, a ball screw method using motor and ball screw, a gear method using motor, rack gear and pinion gear, a belt method using motor, pulley and belt, or a linear motor using coil and permanent magnet.

Referring to FIGS. 3, 4, 19 and 23, the sorting unit 120 may include an unloading unit 122 (See FIG. 23) for carrying out the unloading process.

The unloading unit 122 detaches the tested semiconductor device from the test tray 200, and then transfers the tested semiconductor device to the customer tray. The unloading unit 122 may include an unloading stacker 1221 (See FIG. 23) and an unloading picker 1222 (See FIG. 23).

The unloading stacker 1221 supports the customer tray. The customer tray supported by the unloading stacker 1221 receives the tested semiconductor devices therein. The unloading stacker 1221 may store the plurality of customer trays with the tested semiconductor devices. The customer trays being deposited in the vertical direction may be stored in the unloading stacker 1221.

The unloading picker 1222 may pick up the tested semiconductor device from the test tray 200, and receives the tested semiconductor device in the customer tray positioned at the unloading stacker 1221. When picking up the tested semiconductor device from the test tray 200, the test tray 200 may be positioned at an unloading position 122*a* (See FIG. 23). When the tested semiconductor device is received in the customer tray, the tested semiconductor device is classified in accordance with the testing result, and is then received in the corresponding customer tray on the basis of the class by the use of unloading picker 1222. While the unloading picker 1222 moves in the first axis direction (X-axis direction) and the second axis direction (Y-axis direction), the unloading picker 1222 may transfers the tested semiconductor device. The unloading picker 1222 may be elevated. The test tray 200 is vacant when the unloading unit 122 detaches all of the tested semiconductor devices from the test tray 200. In this case, the sorting unit 120 may transfer the vacant test tray 200 from the unloading unit 122 to the loading unit 121.

The unloading unit 122 may further include an unloading buffer 1223 (See FIG. 23) for temporarily receiving the tested semiconductor device. In this case, the unloading picker 1222 picks up the tested semiconductor device from the test tray 200 positioned at the unloading position 122*a*, and receives the picked-up semiconductor device in the customer tray via the unloading buffer 1223. The unloading picker 1222 may include a first unloading picker 1223*a* (See FIG. 23) for transferring the tested semiconductor device from the test tray 200 to the unloading buffer 1223, and a second unloading picker 1223*b* (See FIG. 23) for transferring the tested semiconductor device from the unloading buffer 1223 to the customer tray.

Although not shown, the unloading unit 122 may include an unloading transferring means for transferring the test tray 200. The unloading transferring means may transfer the test tray 200 by pushing or pulling. The unloading transferring means may transfer the test tray 200 which completes the testing process from the conveyor unit 130 (See FIG. 22) to the unloading position 122*a*. The unloading transferring means may transfer the test tray 200, which is vacant after completing the unloading process, from the unloading position 122*a* to the conveyor unit 130. The unloading transferring means may transfer the test tray 200, which is vacant after completing the unloading process, from the unloading position 122*a* to the loading position 121*a*. The unloading transferring means may transfer the test tray 200 by a cylinder method using hydraulic cylinder or pneumatic cylinder, a ball screw method using motor and ball screw, a gear method using motor, rack gear and pinion gear, a belt method using motor, pulley and belt, or a linear motor using coil and permanent magnet.

Although not shown, the in-line test handler 100 according to the present invention may include the plurality of sorting units 120. In this case, the plurality of sorting units 120 may be provided at fixed intervals along the conveyor unit 130. According to a modified embodiment of the present invention, the sorting unit 120 may be provided in such a manner that the loading unit 121 is provided at a predetermined interval from the unloading unit 122. Accordingly, the in-line test handler 100 according to the present invention may be embodied in such a manner that the loading process and the unloading process may be independently carried out. Thus, the loading process, the unloading process and the testing process are independently carried out in the in-line test handler 100 according to the present invention so that it is possible to minimize a mutual influence of working time consumed for each process. The loading unit 121 and the unloading unit 122 may be provided at a predetermined interval from each other along the conveyor unit 130.

Referring to FIGS. 3, 4 and 19, the conveyor unit 130 transfers the test tray 200 so that the test tray 200 is transferred among the sorting unit 120 and the chamber units 110. The conveyor unit 130 transfers the test tray 200, which is unloaded from the sorting unit 120, to the chamber unit 110. The conveyor unit 130 transfers the test tray 200, which is unloaded from the chamber unit 110, to the sorting unit 120. Thus, the in-line test handler 100 according to the present invention cyclically moves the test tray 200 among the sorting unit 120 and the chamber units 110 provided at fixed intervals by the use of conveyor unit 130, to thereby carry out the loading process, the testing process and the unloading process for the semiconductor device received in the test tray 200.

Figure 24:
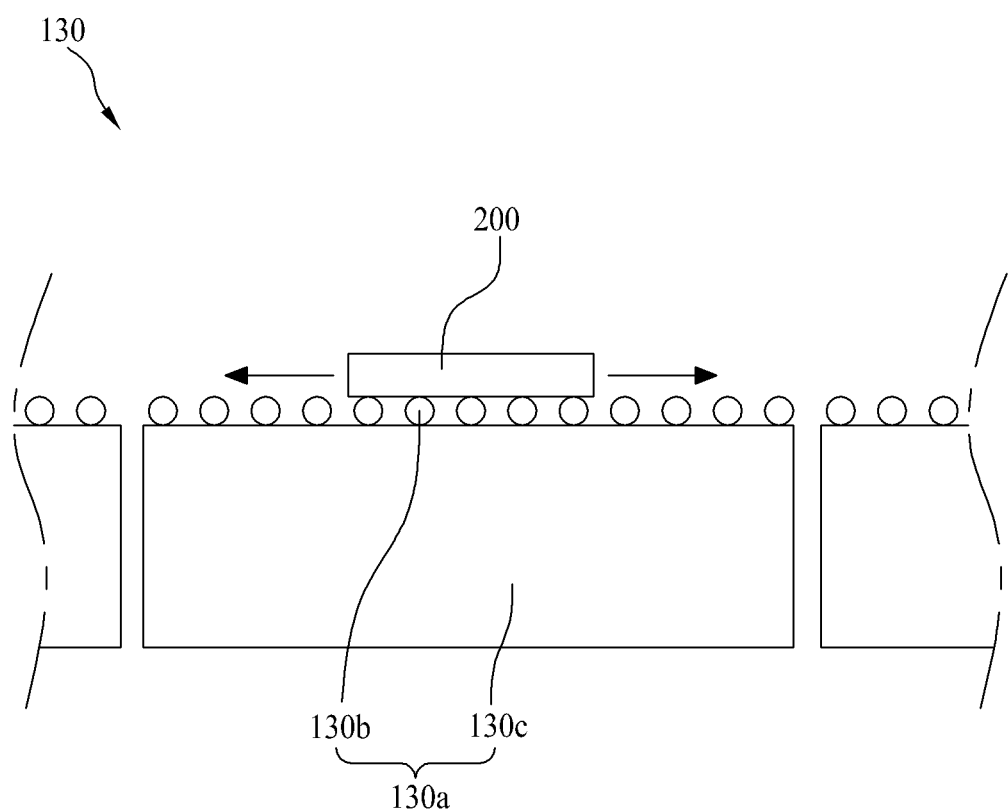
FIG. 24 is a lateral view for illustrating a conveyor unit according to the present invention.

Referring to FIG. 24, the conveyor unit 130 may include the plurality of conveyors 130*a* for transporting the test tray 200. The conveyor 130*a* may include a plurality of rolling members 130*b* provided at fixed intervals. The conveyor 130*a* makes the respective rolling members 130*b* roll with respect to their own rolling axes. The test tray 200 supported by the rolling members 130*b* may be transported in accordance with the rolling of the rolling members 130*b*. The conveyor 130*a* make the rolling members 130*b* roll with respect to their own rolling axes clockwise or counterclockwise. Accordingly, the conveyor 130*a* adjusts the rolling direction of the rolling members 130*b*, to thereby adjust the transporting direction of the test tray 200. Each of the rolling members 130*b* may be formed in a cylindrical shape.

Although not shown, the conveyor 130*a* may include a power source for making the rolling members 130*b* roll with respect to their own rolling axes. The power source may be a motor. The conveyor 130*a* may include a connecting means for connecting the power source with the respective rolling axes of the rolling members 130*b*. The connecting means may be pulley and belt. The conveyor 130*a* may further include a circulating member (not shown) for covering the rolling members 130*b*. The test tray 200 is supported by the circulating member. The circulating member moves according as the rolling members 130*b* provided therein roll with respect to their own rolling axes, whereby the test ray 200 is transported by the circulating member.

The conveyor 130*a* may include an installing member 130*c* for supporting the rolling members 130*b*. The installing member 130*c* supports the rolling members 130*b* so that the test tray 200 supported by the rolling members 130*b* is positioned at a predetermined height. The installing member 130*c* supports the rolling members 130*b* so that the test tray 200 supported by the rolling members 130b is positioned at the height suitable for being transferred to the chamber unit 110 (See FIG. 4) and the sorting unit 120 (See FIG. 4). The installing member 130c may support the rolling members 130b so that the test tray 200 being unloaded from the chamber unit 110 (See FIG. 4) and the sorting unit 120 (See FIG. 4) may be positioned at the height suitable for being transferred to the rolling members 130b.

The conveyor unit 130 may include the plurality of conveyors 130a, wherein the conveyors 130a may be provided adjacently to one another. As the test tray 200 is transported along the conveyors 130a, the test tray 200 may be transferred between the chamber unit 110 (See FIG. 4) and the sorting unit 120 (See FIG. 4). The conveyors 130a, which are operated individually, move the test tray 200 individually. For example, under the circumstance that at least one of the conveyors 130 is stopped, another conveyor 130a may be operated so as to transport the test tray 200. Each of the first conveyor module 131 and the second conveyor module 132 may include the plurality of conveyors 130a.

Figure 25:
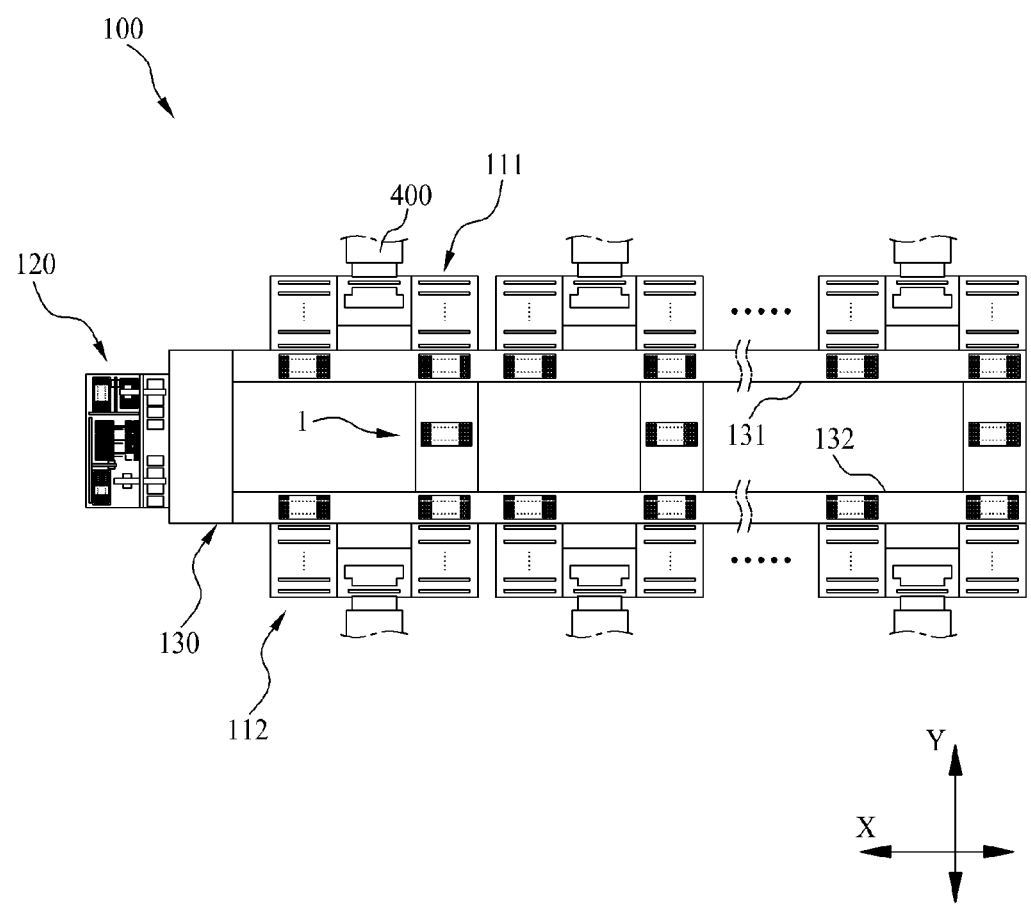
FIG. 25 is a plane view for illustrating an in-line test handler according to the present invention.

Referring to FIG. 25, the conveyor unit 130 may include the first conveyor module 131 and the second conveyor module 132.

The sorting unit 120 and the first chamber unit 111 are connected in-line with each other by the first conveyor module 131. The first conveyor module 131 may include the plurality of conveyors 130a (See FIG. 24). If the in-line test handler 100 according to the present invention includes the plurality of first chamber units 111, the first chamber units 111 may be provided along the first conveyor module 131. The first conveyor module 131 is connected with one side of the spinning apparatus 1. Accordingly, the test tray 200 may be transported between the first conveyor module 131 and the spinning apparatus 1.

Although not shown, the first conveyor module 131 may include a first transferring means for transferring the test tray 200. The first transferring means may transfer the test tray 200 by pushing or pulling. The first transferring means may transfer the test tray which completes the loading process to the first chamber unit 111. The first transferring means may unload the test tray 200 which completes the testing process from the first chamber unit 111. As the first transferring means and the transferring means of the first chamber unit 111 are operated together, the test tray 200 may be transported between the first chamber unit 111 and the first conveyor module 131.

The first transferring means may transfer the test tray unloaded from the first chamber unit 111 to the spinning apparatus 1. The first transferring means may transfer the test tray 200, which is unloaded from the second chamber unit 112, to the spinning apparatus 1. As the first transferring means and the transferring unit 5 (See FIG. 5) of the spinning apparatus 1 are operated together, the test tray 200 may be transported between the first conveyor module 131 and the spinning apparatus 1.

The first transferring means may transfer the test tray 200 by a cylinder method using hydraulic cylinder or pneumatic cylinder, a ball screw method using motor and ball screw, a gear method using motor, rack gear and pinion gear, a belt method using motor, pulley and belt, a linear motor using coil and permanent magnet, or a conveyor method using roller and belt.

The sorting unit 120 and the second chamber unit 112 are connected in-line with each other by the second conveyor module 132. The second conveyor module 132 may include the plurality of conveyors 130a (See FIG. 24). If the in-line test handler 100 according to the present invention includes the plurality of second chamber units 112, the second chamber units 112 may be provided along the second conveyor module 132. The second conveyor module 132 and the first conveyor module 131 may be provided at a predetermined interval from each other in the second axis direction (Y-axis direction). The second conveyor module 132 is connected with the other side of the spinning apparatus 1. Accordingly, the test tray 200 may be transported between the second conveyor module 132 and the spinning apparatus 1. One side of the spinning apparatus 1 may be connected with the first conveyor module 131 and the other side of the spinning apparatus 1 may be connected with the second conveyor module 132. Thus, the test tray 200 may be transported among the first conveyor module 131, the spinning apparatus 1 and the second conveyor module 132.

The in-line test handler 100 according to the present invention may include the plurality of spinning apparatuses 1. In this case, the spinning apparatuses 1 may be positioned between the first conveyor module 131 and the second conveyor module 132, and provided along the first conveyor module 131 and the second conveyor module 132. The spinning apparatuses 1 may be provided at fixed intervals in the first axis direction (X-axis direction). Thus, the in-line test handler 100 according to the present invention enables to efficiently distribute the test tray 200 by the spinning apparatuses 1 regardless of the direction of the chamber units 110 in consideration of time consumed for carrying out each of the loading process, the unloading process and the testing process. Thus, the in-line test handler 100 according to the present invention improves the operational ratio, and reduces the time consumed until the loading process, the testing process and the sorting process for the semiconductor device are completed.

Although not shown, the second conveyor module 132 may include a second transferring means for transferring the test tray 200. The second transferring means may transfer the test tray 200 by pushing or pulling. The second transferring means may transfer the test tray 200 which completes the loading process to the second chamber unit 112. The second transferring means may unload the test tray 200 which completes the testing process from the second chamber unit 112. As the second transferring means and the transferring means of the second chamber unit 112 are operated together, the test tray 200 may be transported between the second chamber unit 112 and the second conveyor module 132.

The second transferring means may transfer the test tray 200 unloaded from the second chamber unit 112 to the spinning apparatus 1. The second transferring means may transfer the test tray 200, which is unloaded from the second chamber unit 112, to the spinning apparatus 1. As the second transferring means and the transferring unit 5 (See FIG. 5) of the spinning apparatus 1 are operated together, the test tray 200 may be transported between the spinning apparatus 1 and the second conveyor module 132.

The second transferring means may transfer the test tray 200 by a cylinder method using hydraulic cylinder or pneumatic cylinder, a ball screw method using motor and ball screw, a gear method using motor, rack gear and pinion gear, a belt method using motor, a linear motor using coil and permanent magnet or a conveyor method using roller and belt.

Referring to FIGS. 17 to 19, each of the first conveyor module 131 and the second conveyor module 132 may include the plurality of conveyors 130a (See FIG. 17) provided at fixed intervals in the vertical direction (Z-axis direction).

The first conveyor module 131 may individually transport the plurality of test trays 200 along the plurality of transporting paths formed in the vertical direction (Z-axis direction). For example, the first conveyor module 131 may include the conveyor 130a for transporting the test tray 200 in accordance with the first transporting path P1 (See FIG. 17), and the conveyor 130a for transporting the test tray 200 in accordance with the second transporting path P2 (See FIG. 17). In this case, under the circumstance that the test tray 200 is stopped by the conveyor 130a for forming the first transporting path P1, the first conveyor module 131 may be operated to transport the test tray 200 by the use of conveyor 130a for forming the second transporting path P2.

The second conveyor module 132 may individually transport the plurality of test trays 200 along the plurality of transporting paths formed in the vertical direction (Z-axis direction). For example, the second conveyor module 132 may include the conveyor 130a for transporting the test tray 200 in accordance with the first transporting path P1, and the conveyor 130a for transporting the test tray 200 in accordance with the second transporting path P2. In this case, under the circumstance that the test tray 200 is stopped by the conveyor 130a for forming the first transporting path P1, the second conveyor module 132 may be operated to transport the test tray 200 by the use of conveyor 130a for forming the second transporting path P2.

If the test tray 200 is transferred from the conveyor unit 130 to the chamber unit 110 or from the chamber unit 110 to the conveyor unit 130, the in-line test handler 100 according to the present invention may transport the test tray 200 by the use of first transporting path (P1). If there is the test tray 200 waited in the first transporting path P1, the in-line test handler 100 according to the present invention transfers the next test tray 200 by the use of second transporting path P2 so as to avoid the testing tray 200 waited in the first transporting path P1.

If the test tray 200 passing through the first chamber unit 111 is directly transferred to the sorting unit 120 without passing through the second chamber unit 112, the in-line test handler 100 according to the present invention may transfer the corresponding test tray 200 by the use of second transporting path P2. If the test tray 200 passing through the second chamber unit 112 is directly transferred to the sorting unit 120 without passing through the first chamber unit 111, the in-line test handler 100 according to the present invention may transfer the corresponding test tray 200 by the use of second transporting path P2. In this case, the spinning apparatus 1 may change the transporting path of the test tray 200 transported between the first conveyor module 131 and the second conveyor module 132.

According to the present invention, it is possible to prevent a delay of working time even though there is a difference in time period for each of loading process, unloading process and testing process, to thereby improve yield for the semiconductor device.

Also, even if any one of the apparatuses for carrying out the loading process, unloading process and testing process has problems, it is possible to prevent the entire system from being stopped, to thereby prevent loss of working time.

Furthermore, it is possible to improve easiness of working and degree of freedom on the process for arranging the apparatuses for carrying out the loading process, unloading process and testing process, to thereby realize easiness of working on the process for expanding or reducing the processing line, and to reduce an additional cost consumed for the above working.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An in-line test handler comprising:
    a first chamber unit for carrying out a testing process of a semiconductor device;
    a second chamber unit for carrying out a testing process of a semiconductor device, wherein the first and second chamber units facing in the different directions are provided at a predetermined interval from each other;
    a sorting unit for carrying out a loading process for receiving the semiconductor device to be tested in the test tray, and an unloading process for detaching the tested semiconductor device from the test tray, wherein the sorting unit is provided at a predetermined interval from the first chamber unit and the second chamber unit;
    a conveyor unit for transporting the test tray so as to make the sorting unit, the first chamber unit and the second chamber connected in-line; and
    a spinning apparatus for spinning the test tray, which spins the test tray so as to carry out the testing process under the circumstances that the semiconductor devices received in the test tray are arranged at the same position in each of the first chamber unit and the second chamber unit.

2. The in-line test handler according to claim 1, wherein the first chamber unit and the second chamber unit are provided in opposite directions, and the spinning apparatus spins the test tray so as to make the test tray, which is unloaded from the first chamber unit, spin at an angle of 180°, and then to supply the test tray to the second chamber unit.

3. The in-line test handler according to claim 1, wherein the spinning apparatus spins the test tray being maintained in a horizontal state.

4. The in-line test handler according to claim 1,
    wherein the conveyor unit includes a first conveyor module for transporting the test tray so as to make the sorting unit and the first chamber unit connected in-line, and a second conveyor module for transporting the test tray so as to make the sorting unit and the second chamber unit connected in-line, and
    wherein the spinning apparatus is provided between the first conveyor module and the second conveyor module so as to make the first conveyor module and the second conveyor module connected in-line.

5. The in-line test handler according to claim 1, wherein the spinning apparatus includes:
    a supporting unit for supporting the test tray;
    a base unit provided below the supporting unit, the base unit to which the supporting unit is spinnably connected; and
    a spinning unit provided in the base unit, wherein the spinning unit makes the supporting unit spin with a spinning axis formed in a vertical direction from the base unit toward the supporting unit so as to spin the test tray being supported by the supporting unit.

6. The in-line test handler according to claim 1, wherein the spinning apparatus includes:
    a supporting unit for supporting the test tray;
    a base unit to which the supporting unit is spinnably connected;
    a spinning unit provided in the base unit, wherein the spinning unit makes the supporting unit spin so as to spin the test tray positioned at a spinning position in the supporting unit; and a transferring unit provided in the supporting unit, wherein the transferring unit transfers the test tray, which is unloaded from the conveyor unit, to the spinning position, and unloads the test tray, which spins by the spinning unit, from the conveyor unit.

7. The in-line test handler according to claim 6, wherein the transferring unit includes:
    an inserting member to be inserted into the test tray;
    an elevating member connected with the inserting member;
    an elevating module for elevating the elevating member so as to make the inserting member be inserted into the test tray or detached from the test tray; and
    a driving unit for moving the elevating module so as to transfer the test tray with the inserting member inserted thereinto.

8. The in-line test handler according to claim 1, wherein the spinning apparatus includes:
    a supporting unit for supporting the test tray;
    a base unit provided below the supporting unit, the base unit to which the supporting unit is spinnably connected;
    a spinning unit provided in the base unit, wherein the spinning unit makes the supporting unit spin at an angle of 180° so that the test tray being supported by the supporting unit spins at an angle of 180°;
    a protruding member protruding from the supporting unit in a lower direction from the supporting unit toward the base unit; and
    an absorbing unit connected with the base unit so as to elastically support the protruding member which spins at an angle of 180° according as the spinning unit makes the test tray spin at an angle of 180°.

9. The in-line test handler according to claim 1, wherein the spinning apparatus includes:
    a supporting unit for supporting the test tray;
    a base unit to which the supporting unit is spinnably connected;
    a spinning unit provided in the base unit, wherein the spinning unit spins the supporting unit so as to spin the test tray being supported by the supporting unit;
    a transferring unit, provided in the supporting unit, for transferring the test tray between the supporting unit and the conveyor unit; and
    an elevating unit for elevating the supporting unit so as to adjust a height of the test tray being transferred between the supporting unit and the conveyor unit.

10. An apparatus for spinning a test tray comprising:
    a supporting unit for supporting a test tray transported between first and second chamber units facing in the different directions, wherein the first chamber unit is provided at a predetermined interval from the second chamber unit;
    a base unit to which the supporting unit is spinnably connected; and
    a spinning unit, provided in the base unit, for spinning the supporting unit so as to spin the test tray being supported by the supporting unit,
    wherein the spinning unit spins the test tray so that semiconductor devices received in the test tray are tested at the same arrangement in each of the first chamber unit and the second chamber unit.

11. The apparatus according to claim 10, wherein the spinning unit makes the test tray spin at an angle of 180° so that the semiconductor devices are tested at the same arrangement in each of the first and second chamber units facing in opposite directions.

12. The apparatus according to claim 10,
    wherein the base unit is provided below the supporting unit, and
    wherein the spinning unit makes the supporting unit spin with respect to a spinning axis formed in a vertical direction from the base unit toward the supporting unit so that the test tray being supported by the supporting unit spins while being maintained in a horizontal state.

13. The apparatus according to claim 10, further comprising a transferring unit, provided in the supporting unit, for transferring the test tray,
    wherein the transferring unit transfers the test tray unloaded from the first chamber unit to the supporting unit, and unloads the test tray from the supporting unit so as to supply the test tray which spins by the spinning unit to the second chamber unit.

14. The apparatus according to claim 13, wherein the transferring unit includes:
    an inserting member to be inserted into the test tray;
    an elevating member connected with the inserting member;
    an elevating module for elevating the elevating member so as to make the inserting member be inserted into the test tray or detached from the test tray; and
    a driving unit for moving the elevating module so as to transfer the test tray with the inserting member inserted thereinto.

15. The apparatus according to claim 10, wherein the spinning apparatus includes:
    a protruding member protruding from the supporting unit in a direction from the supporting unit toward the base unit; and
    an absorbing unit connected with the base unit so as to elastically support the protruding member which spins at an angle of 180° according as the spinning unit makes the test tray spin at an angle of 180°.

16. The apparatus according to claim 10, further comprising an elevating unit for elevating the base unit so as to elevate the supporting unit, wherein the elevating unit elevates the base unit so as to adjust a height of the test tray being supported by the supporting unit.

* * * * *